United States Patent
Song et al.

(10) Patent No.: US 11,609,368 B2
(45) Date of Patent: Mar. 21, 2023

(54) DISPLAY DEVICE HAVING BANK LAYERS

(71) Applicant: SAMSUNG DISPLAY CO., LTD., Yongin-si (KR)

(72) Inventors: In Seok Song, Pocheon-si (KR); Byung Chul Kim, Yongin-si (KR); Jang Wi Ryu, Yongin-si (KR); Gak Seok Lee, Hwaseong-si (KR); Ha Lim Ji, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 204 days.

(21) Appl. No.: 17/188,170

(22) Filed: Mar. 1, 2021

(65) Prior Publication Data
US 2022/0003909 A1  Jan. 6, 2022

(30) Foreign Application Priority Data
Jul. 3, 2020  (KR) .......................... 10-2020-0081934

(51) Int. Cl.
G02B 5/28  (2006.01)
H01L 27/32  (2006.01)

(52) U.S. Cl.
CPC ............ G02B 5/286 (2013.01); *H01L 27/322* (2013.01); *H01L 27/3246* (2013.01)

(58) Field of Classification Search
CPC .... G02B 5/286; H01L 27/322; H01L 27/3246
See application file for complete search history.

(56) References Cited

U.S. PATENT DOCUMENTS

| | | | | |
|---|---|---|---|---|
| 2008/0001528 | A1* | 1/2008 | Eida | ...................... H01J 29/898 313/506 |
| 2010/0177417 | A1* | 7/2010 | Jang | ...................... G02B 5/223 430/7 |
| 2013/0155537 | A1* | 6/2013 | Liu | ................... G02F 1/133514 359/891 |

(Continued)

FOREIGN PATENT DOCUMENTS

| | | | |
|---|---|---|---|
| JP | 2006294765 A | * | 10/2006 |
| KR | 10-0218498 | | 9/1999 |
| KR | 10-1785642 | | 10/2017 |

*Primary Examiner* — Tracie Y Green
(74) *Attorney, Agent, or Firm* — F. Chau & Associates, LLC

(57) ABSTRACT

A display device includes: a substrate including light-emitting areas and a light-blocking area including a spacer area; a color filter layer including color filters and a dummy color pattern, wherein the color filters are disposed in the light emitting areas, and the dummy color pattern is disposed in the spacer area; a light-transmitting layer disposed on the color filter layer and including a light-transmitting pattern and a light-transmitting dummy pattern, wherein the light-transmitting pattern is disposed on the color filters, and the light-transmitting dummy pattern is disposed on the dummy color pattern; and a bank layer disposed on the dummy color pattern, wherein the bank layer includes a spacer part disposed in the light-blocking area, and a bank part disposed in the light-blocking area, wherein the spacer part overlaps the spacer area, wherein the bank part has a smaller height than the spacer part with respect to the substrate.

20 Claims, 18 Drawing Sheets

(56) References Cited

U.S. PATENT DOCUMENTS

| | | | |
|---|---|---|---|
| 2014/0070350 A1* | 3/2014 | Kim | .................... H01L 31/0232 |
| | | | 438/70 |
| 2017/0199431 A1* | 7/2017 | Kim | .................. G02F 1/133514 |
| 2020/0168668 A1* | 5/2020 | Kim | .................... H01L 51/5271 |
| 2021/0091161 A1* | 3/2021 | Baek | ................... H01L 27/3262 |

* cited by examiner

320 : 321,322
DP_3 : 322,332,342,TPL_2

DISPLAY DEVICE HAVING BANK LAYERS

CROSS-REFERENCE TO RELATED APPLICATION

This application claims priority under 35 U.S.C. § 119 to Korean Patent Application No. 10-2020-0081934, filed on Jul. 3, 2020, the disclosure of which is incorporated by reference herein in its entirety.

TECHNICAL FIELD

The present disclosure relates to a display device, and more particularly to, a display device including a bank layer.

DISCUSSION OF THE RELATED ART

Display devices have become increasingly utilized with the development of multimedia, and various types of display devices, such as a liquid crystal display (LCD) device, an organic light-emitting diode (OLED) display device, or the like, have been used.

A self-luminous display device, which is a type of display device, includes self-luminous elements such as OLEDs. Typical self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device does not need a separate light source and can thus has a low-power consumption, and can provide a relatively thin and light-weight display device with high-quality characteristics such as wide viewing angles, high luminance and contrast, and a fast response speed.

SUMMARY

According to an exemplary embodiment of the present invention, a display device includes: a substrate including light-emitting areas and a light-blocking area including a spacer area; a color filter layer disposed on the substrate and including color filters, and a dummy color pattern, wherein the color filters are disposed in the light emitting areas, and the dummy color pattern is disposed in the spacer area; a light-transmitting layer disposed on the color filter layer and including a light-transmitting pattern and a light-transmitting dummy pattern, wherein the light-transmitting pattern is disposed on the color filters, and the light-transmitting dummy pattern is disposed on the dummy color pattern; and a bank layer disposed on the dummy color pattern, wherein the bank layer includes a spacer part disposed in the light-blocking area, and a bank part disposed in the light-blocking area, wherein the spacer part overlaps the spacer area, wherein the bank part has a smaller height than the spacer part with respect to the substrate, and does not overlap the spacer area.

In an exemplary embodiment of the present invention, the color filters include a first color filter, a second color filter, and a third color filter, wherein the first color filter selectively transmits light of a first color therethrough, the second color filter selectively transmits light of a second color therethrough, and wherein the third color filter selectively transmits light of a third color therethrough.

In an exemplary embodiment of the present invention, the dummy color pattern includes the same material as at least one of the first, second, or third color filters.

In an exemplary embodiment of the present invention, the dummy color pattern includes a first dummy color pattern and a second dummy color pattern disposed on the first dummy color pattern. The first dummy color pattern includes the same material as the first color filter, and the second dummy color pattern includes the same material as the second color filter.

In an exemplary embodiment of the present invention, the display device further includes: a wavelength conversion layer disposed on the color filter layer, in the light-emitting areas, wherein the light-transmitting pattern is disposed on the first color filter, and the wavelength conversion layer includes a first wavelength conversion pattern, and a second wavelength conversion pattern, wherein the first wavelength conversion pattern is disposed on the second color filter, and the second wavelength conversion pattern is disposed on the third color filter.

In an exemplary embodiment of the present invention, the first color is blue, the second color is green, and third color is red.

In an exemplary embodiment of the present invention, the light-transmitting dummy pattern overlaps with the dummy color pattern. The light-transmitting dummy pattern and the dummy color pattern form the dummy pattern, and the spacer part overlaps with the dummy pattern.

In an exemplary embodiment of the present invention, the spacer part and the bank part are integrally formed.

In an exemplary embodiment of the present invention, the bank layer at least partially covers the dummy pattern.

In an exemplary embodiment of the present invention, the bank layer is not disposed in the light-emitting areas.

According to an exemplary embodiment of the present invention, a display device includes: a display substrate including a first substrate; subpixel electrodes disposed on the first substrate and provided in their respective subpixels; a pixel-defining film disposed on the surface of the first substrate, along boundaries of each of the subpixels, and exposes the subpixel electrodes; an emission layer disposed on the subpixel electrodes exposed by the pixel-defining film; and a common electrode disposed on the emission layer; and a color conversion substrate including a second substrate including a plurality of light-emitting areas and a light-blocking area surrounding the light-emitting areas; a color filter layer disposed on a surface of the second substrate facing the first substrate and includes a plurality of color filters disposed in their respective light-emitting areas and a dummy color pattern disposed in the light-blocking area; a light-transmitting layer disposed on the color filter layer and includes a light-transmitting dummy pattern disposed on the dummy color pattern; and a bank layer disposed in the light-blocking area, wherein the dummy color pattern and the light-transmitting dummy pattern form a dummy pattern, and the bank layer includes a spacer part and a bank part, wherein the spacer part overlaps the dummy pattern, and wherein the bank part does not overlap with the dummy pattern and has a larger height than the spacer part with respect to the first substrate.

In an exemplary embodiment of the present invention, the color filters include a first color filter, a second color filter, and a third color filter, wherein the first color filter selectively transmits light of a first color therethrough and overlaps a first light-emitting area among other light-emitting areas, wherein the second color filter selectively transmits light of a second color therethrough and overlaps a second light-emitting area among other light-emitting areas, wherein the third color filter selectively transmits light of a third color therethrough and overlaps a third light-emitting area among other light-emitting areas.

In an exemplary embodiment of the present invention, the dummy color pattern includes the same material as at least one of the first, second, or third color filters.

In an exemplary embodiment of the present invention, the dummy color pattern includes a first dummy color pattern and a second dummy color pattern disposed on the first dummy color pattern.

In an exemplary embodiment of the present invention, the first dummy color pattern includes the same material as the first color filter, and the second dummy color pattern includes the same material as the second color filter.

In an exemplary embodiment of the present invention, the light-transmitting layer further includes a light-transmitting pattern disposed on the first color filter, and the color conversion substrate further includes a first wavelength conversion pattern, and a second wavelength conversion pattern, wherein the first wavelength conversion pattern converts light of the first color into light of the second color and is disposed on the second color filter, wherein the second wavelength conversion pattern converts light of the first color into light of the third color and is disposed on the third color filter.

In an exemplary embodiment of the present invention, the bank part and the spacer part are integrally formed.

In an exemplary embodiment of the present invention, the bank layer overlaps with the pixel-defining film in a thickness direction.

In an exemplary embodiment of the present invention, the spacer part is disposed on the display substrate.

In an exemplary embodiment of the present invention, the display device further includes: a filling layer disposed between the display substrate and the color conversion substrate to couple the display substrate and the color conversion substrate to each other.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

The present invention will now be described more fully hereinafter with reference to the accompanying drawings. The present invention may, however, be embodied in different forms and should not be construed as limited to the embodiments set forth herein.

It will also be understood that when a layer is referred to as being "on" another layer or substrate, it can be directly on the other layer or substrate, or intervening layers may be present. The same reference numbers may indicate the same components throughout the specification, and thus, repetitive descriptions may be omitted.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present invention. Similarly, the second element could also be termed the first element.

Exemplary embodiments of the present invention will hereinafter be described with reference to the accompanying drawings.

Figure 1:
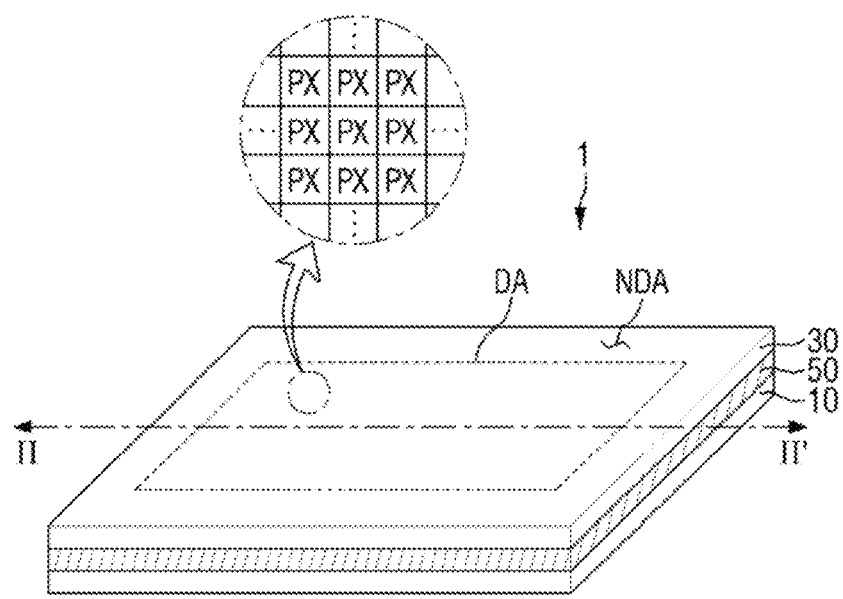
FIG. 1 is a perspective view of a display device according to an exemplary embodiment of the present invention.
Figure 1:
Figure 2:
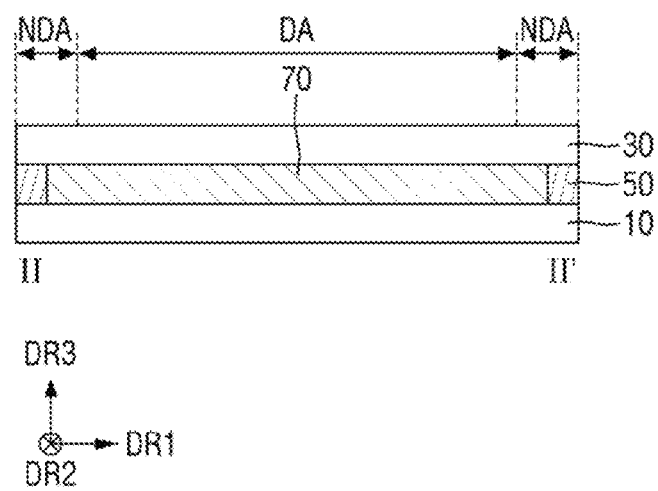
FIG. 2 is across-sectional view taken along line II-II' of FIG. 1.

FIG. 1 is a perspective view of a display device according to an exemplary embodiment of the present invention. FIG. 2 is across-sectional view taken along line II-II' of FIG. 1.

Referring to FIGS. 1 and 2, a display device 1 may refer to nearly all types of electronic devices that include a display screen. Examples of the display device 1 may include a television (TV), a notebook computer, a monitor, a billboard, a mobile phone, a smartphone, a tablet personal computer (PC), an electronic watch, a smartwatch, a watchphone, a mobile communication terminal, an electronic notepad, an electronic book, a portable multimedia player (PMP), a navigation device, a gaming console, a digital camera, and an Internet-of-Things (IoT) device.

First, second, and third directions DR1, DR2, and DR3 are illustrated in the accompanying drawings. For example, the first and second directions DR1 and DR2 may be directions that are substantially perpendicular to each other within the same plane. The third direction DR3 may be a direction that is substantially perpendicular to the plane that includes the first and second directions DR1 and DR2. The third direction DR3 may be substantially perpendicular to each of the first and second directions DR1 and DR2. For example, the third direction DR3 refers to the thickness direction of the display device 1.

Unless specified otherwise, the terms "above" and "top", as used herein, refer to the third direction DR3 (or the display direction of the display device 1), and the term "top surface", as used herein, refers to a surface that is directed in the third direction DR3. Also, unless specified otherwise, the terms "below" and "bottom", as used herein, refer to the opposite direction of the third direction DR3 (or the opposite direction of the display direction of the display device 1), and the term "bottom surface", as used herein, refers to a surface that is directed in the opposite direction of the third direction DR3. For example, the "top surface" may be opposite the "bottom surface" in the third direction DR3.

The display device 1 may have, for example, a rectangular shape in a plan view. For example, the display device 1 may have a rectangular shape having long sides in the first direction DR1 and short sides in the second direction DR2 in a plan view. The corners where the long sides, in the first direction DR1, of the display device 1 and the short sides, in the second direction DR2, of the display device 1 meet may be right-angled or may be rounded to have a predetermined curvature. The planar shape of the display device 1 is not particularly limited. For example, the display device 1 may have various other shapes such as a circular shape in a plan view.

The display device 1 may include a display area DA, which displays an image, and a non-display area NDA, which does not display an image. The display area DA may include a plurality of pixels PX. The non-display area NDA may be disposed on the periphery of the display area DA and may at least partially surround the display area DA. For example, the non-display area NDA may completely surround the display area DA.

The display device 1 may include a display substrate 10 and a color conversion substrate 30, which faces the display substrate 10. The display device 1 may further include a sealing member 50, which couples the display substrate 10 and the color conversion substrate 30 to each other, and a filling layer 70, which fills the gap between the display substrate 10 and the color conversion substrate 30.

Light of a particular peak wavelength may be emitted from a plurality of emission areas in the display area DA of the display substrate 10. The display substrate 10 may include elements and circuits for displaying an image. For example, the display substrate 10 may include pixel circuits such as switching elements, a pixel-defining film, and self-luminous elements. For example, the pixel defining film may define the emission areas and a non-emission area in the display area DA. For example, each of the self-luminous elements may include at least one of an organic light-emitting diode (OLED), a quantum-dot light-emitting diode (QLED), an inorganic material-based micro light-emitting diode (micro LED), and an inorganic material-based nano light-emitting diode (nano LED). The self-luminous elements will hereinafter be described as being, for example, OLEDs.

The color conversion substrate 30 may be disposed above the display substrate 10 and may face the display substrate 10. The color conversion substrate 30 may convert the peak wavelength of light emitted from the display substrate and may transmit the wavelength-converted light therethrough, or may transmit the light emitted from the display substrate 10 as it is while maintaining the peak wavelength of the emitted light.

The sealing member 50 may be disposed between the display substrate 10 and the color conversion substrate 30, in the non-display area NDA. The sealing member 50 may be disposed along the edges of each of the display substrate 10 and the color conversion substrate 30, in the non-display area NDA, and may surround the display area DA in a plan view. The display substrate 10 and the color conversion substrate 30 may be coupled together by the sealing member 50.

The filling layer 70 may be disposed in the space between the display substrate 10 and the color conversion substrate 30, and may be surrounded by the sealing member 50. The filling layer 70 may fill the gap between the display substrate 10 and the color conversion substrate 30. The filler layer 70 may be formed of a material through which light can pass through. The filling layer 70 may include an organic material. For example, the filling layer 70 may be formed of silicon (Si) based organic material or an epoxy-based organic material, but the present invention is not limited thereto.

Figure 3:
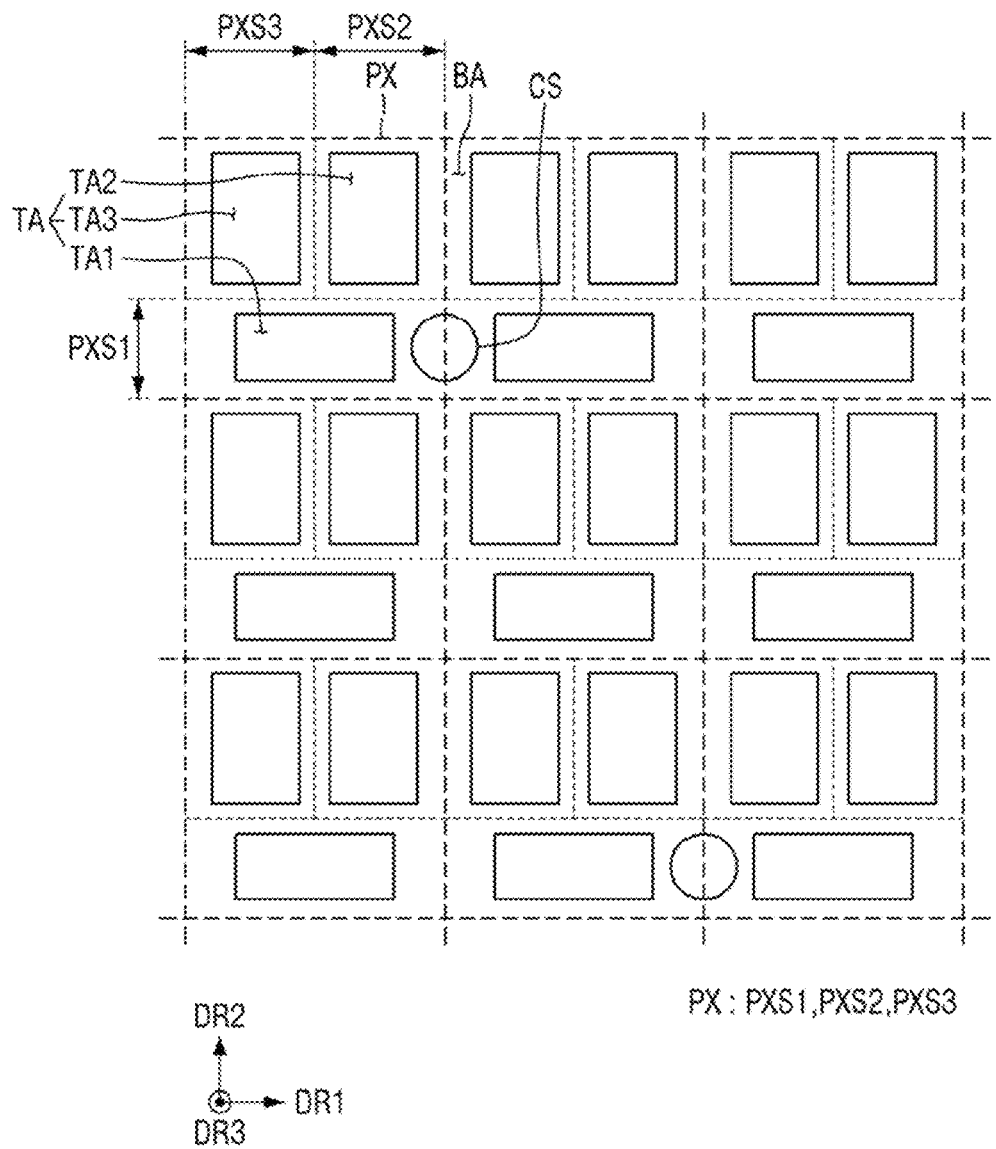
FIG. 3 is a layout view illustrating the arrangement of pixels of the display device of FIG. 1.

FIG. 3 is a layout view illustrating the arrangement of pixels of the display device of FIG. 1.

Referring to FIGS. 1 and 3, the display area DA of the display device 1 may include a plurality of pixels PX. The pixels PX may refer to minimal repeating units for displaying an image. Each of the pixels PX may include a plurality of subpixels PXS. For example, each of the pixels PX may include a first subpixel PXS1, which emits light of a first color, a second subpixel PXS2, which emits light of a second color, and a third subpixel PXS3, which emits light of a third color, but the present invention is not limited thereto. The first, second, and third colors may be blue, green, and red, respectively. One first subpixel PXS1, one second subpixel PXS2, and one third subpixel PXS3 may be provided in each of the pixels PX.

Each of the pixels PX may include a plurality of light-emitting areas TA and a light-blocking area BA around the light-emitting areas TA. The light-emitting areas TA may be areas that output light emitted from the display substrate 10 to the outside of the display device 1 through the color conversion substrate 30, and the light-blocking area BA may be an area through which the light emitted from the display substrate 10 does not pass through.

The light-emitting areas TA (TA: TA1, TA2, TA3) may include first, second, and third light-emitting areas TA1, TA2, and TA3. The first, second, and third light-emitting areas TA1, TA2, and TA3 may be the light-emitting areas of the first, second, and third subpixels PXS1, PXS2, and PXS3, respectively.

For example, first light-emitting areas TA1, second light-emitting areas TA2, and third light-emitting areas TA3 may be arranged in a so-called "S stripe"-type fashion. For example, the second light-emitting areas TA2 and the third light-emitting areas TA3 may be arranged in each odd-numbered row to alternate with each other in a row direction. The first light-emitting areas TA1 may be arranged in each even-numbered row to repeat one after another in the row direction.

The shapes of the subpixels PXS in each of the pixels PX may be similar to the shape of the light-emitting areas TA of the subpixels PXS in each of the pixels PX, but the present invention is not limited thereto. The planar shapes and the arrangement of the light-emitting areas TA of the subpixels PXS in each of the pixels PX are not limited to those illustrated in FIG. 3 and may vary.

In each of the pixels PX, the light-blocking area BA may be disposed to surround a plurality of light-emitting areas TA. In each of the pixels PX, the light-emitting areas TA of the subpixels PXS may be divided by the light-blocking area BA. The light-blocking areas BA of a pair of adjacent pixels PX may adjoin each other. The light-blocking areas BA of the pair of adjacent pixels PX may be connected to each other. The light-blocking areas of all the pixels PX may be connected, but the present invention is not limited thereto.

The display device 1 may include one or more spacers CS. The spacers CS may be disposed in light-blocking areas BA.

The spacers CS may be disposed in the light-blocking areas BA and may not overlap with light-emitting areas TA. For example, each of the spacers CS may be disposed across a pair of adjacent pixels PX. The diameter of the spacers CS may be greater than the minimum width of the light-blocking areas BA. FIG. 3 illustrates that each of the spacers CS is disposed across two adjacent pixels PX, but the present invention is not limited thereto. In addition, a plurality of spacers CS may be disposed in each of the pixels PX.

The spacers CS may maintain the cell gap between the display substrate 10 and the color conversion substrate 30. The spacers CS will be described later in detail.

The pixels PX may be alternately arranged in the row direction and a column direction. The shapes and the arrangement of the subpixels PXS in each of the pixels PX may be uniform, but the present invention is not limited thereto. The pixels PX, each including a plurality of subpixels PXS, may have a polygonal shape such as a square shape, but the present invention is not limited thereto. In addition, the pixels PX may have a rhombus shape, a rectangular shape, or the like.

Figure 4:
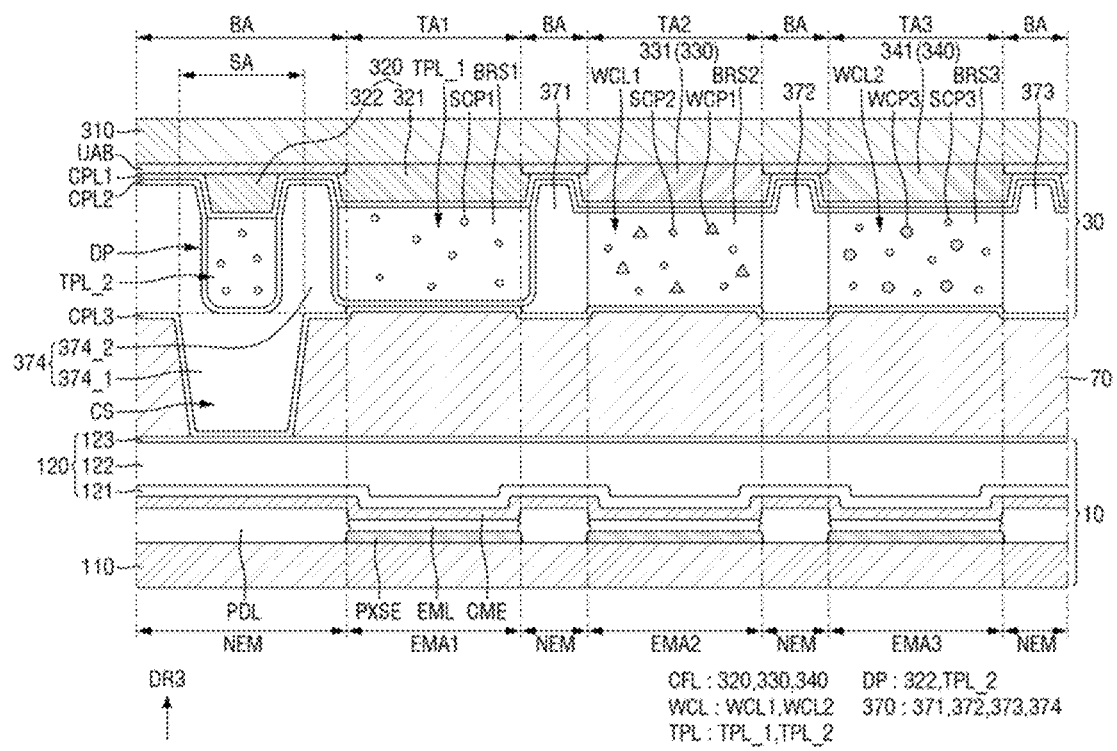
FIG. 4 is a cross-sectional view of the display device of FIG. 1.

FIG. 4 is a cross-sectional view of the display device of FIG. 1.

Referring to FIG. 4, the display substrate 10 may include a first substrate 110, a pixel-defining film PDL, which is disposed on a surface of the first substrate 110, a plurality of light-emitting elements, and a thin-film encapsulation structure 120, which covers the light-emitting elements. The color conversion substrate 30 may include a second substrate 310, a color control structure (321, 330, 340, WCL, and TPL_1), which is disposed on a surface of the second substrate 310 that faces the first substrate 110, and a spacer CS.

The display substrate 10 will hereinafter be described.

The first substrate 110 may be an insulating substrate. The first substrate 110 may include, for example, a transparent material. For example, the first substrate 110 may include a transparent insulating material such as glass or quartz. For example, the first substrate 110 may be a rigid substrate. However, the present invention is not limited to this example. For example, the first substrate 110 may include plastic such as polyimide (PI) and may have a flexible characteristic such as bendability, foldability, or rollability.

A plurality of subpixel electrodes PXSE may be disposed on the surface of the first substrate 110. The subpixel electrodes PXSE may be respectively disposed in different subpixels PXS. The subpixel electrodes PXSE may be separate from one another. A circuit layer, which drives the subpixel electrodes PXSE may be disposed between the first substrate 110 and the subpixel electrodes PXSE. For example, the circuit layer may include a plurality of thin-film transistors and a capacitor.

The subpixel electrodes PXSE may be the first electrodes (e.g., anode electrodes) of light-emitting elements (or light-emitting diodes (LEDs)). The subpixel electrodes PXSE may have a structure in which a high-work-function material layer of indium tin oxide (ITO), indium zinc oxide (IZO), zinc oxide (ZnO), or indium oxide ($In_2O_3$) and a reflective material layer of silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof are stacked. The high-work-function material may be disposed on the reflective material layer, close to emission layers EML. The subpixel electrodes PXSE may have a multilayer structure of ITO/Mg, ITO/MgF, ITO/Ag, or ITO/Ag/ITO, but the present invention is not limited thereto.

The pixel-defining film PDL may be disposed on the surface of the first substrate 110, along the boundaries of the subpixels PXS. The pixel-defining film PDL may be disposed on the subpixel electrodes PXSE and may include openings that expose the subpixel electrodes PXSE. Non-emission areas NEM and emission areas EMA may be divided by the pixel-defining film PDL and the openings in the pixel-defining film PDL. The pixel-defining film PDL may space apart and insulate the subpixel electrodes PXSE from one another.

The pixel-defining film PDL may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). In addition, the pixel-defining film PDL may include an inorganic material.

The emission layers EML are disposed on parts of the subpixel electrodes PXSE exposed by the pixel-defining film PDL. In a case where the display device 1 is an OLED display device, the emission layers EML may include organic layers that include an organic material. The organic layers may include organic light-emitting layers and may further include a hole injection/transport layer and/or an electron injection/transport layer as auxiliary layers that assist with the emission of light. In addition, in a case where the display device 1 is a micro-LED display device or a nano-LED display device, the emission layers EML may include an inorganic material such as an inorganic semiconductor.

In an exemplary embodiment of the present invention, the emission layers EML may each have a tandem structure including a plurality of organic light-emitting layers disposed to overlap with one another in a thickness direction and one or more charge generation layers disposed between the plurality of organic light-emitting layers. The plurality of organic light-emitting layers may emit light of the same wavelength or light of different wavelengths. At least some of the layers of each of the emission layers EML may be separated from each other in the area between adjacent subpixels PXS.

The wavelength of light emitted by the emission layers EML may be substantially uniform throughout the subpixels PXS. For example, the emission layers EML may all emit blue light or ultraviolet light, and due to the presence of a wavelength conversion layer WCL in the color control structure (321, 330, 340, WCL, and TPL_1), the display device 1 may display different colors in different subpixels PXS.

In addition, the wavelength of light emitted by the emission layers EML may differ from one subpixel PXS to another subpixel PXS. For example, the emission layer EML of a first subpixel PXS1 may emit light of a first color, and the emission layer EML of a second subpixel PXS2 may emit light of a second color. In addition, the emission layer EML of a third subpixel PXS3 may emit light of a third color.

A common electrode CME may be disposed on the emission layers EML. The common electrode CME may be in contact not only with the emission layers EML, but also with the top surface of the pixel-defining film PDL.

Parts of the common electrode CME may all be connected without regard to distinction between the subpixels PXS. For example, the common electrode CME may be a full-surface electrode disposed on the entire surface of the first substrate 110 without regard to distinction between the subpixels PXS. However, the present invention is not limited thereto, and for example, the common electrode CME may be divided. The common electrode CME may be the second electrodes (e.g., cathode electrodes) of LEDs.

The common electrode CME may include a low-work-function material layer of, for example, Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The common electrode CME may further include a transparent metal oxide layer, which is disposed on the low-work-function material layer.

The subpixel electrodes PXSE, the emission layer EML, and the common electrode CME may form light-emitting elements (e.g., OLEDs). Light emitted by the emission layers EML may be output in the display direction of the display device 1, for example, in the third direction DR3, via the common electrode CME.

The thin-film encapsulation structure 120 may be disposed on the common electrode CME. The thin-film encapsulation structure 120 may include one or more thin-film encapsulation layers. For example, the thin-film encapsulation layers may include a first inorganic film 121, an organic film 122, and a second inorganic film 123. The first and second inorganic films 121 and 123 may include, for example, silicon nitride, silicon oxide, or silicon oxynitride. The organic film 122 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The color conversion substrate 30 will hereinafter be described.

The color conversion substrate 30 may be disposed to face the thin-film encapsulation structure 120 of the display substrate 10. For example, the color conversion substrate 30 may be disposed above the thin-film encapsulation structure 120. Referring to the cross-sectional structure of the color conversion substrate 30 in the opposite direction of the third direction DR3 (i.e., in the lower direction), the second substrate 310 of the color conversion substrate 30 may include a transparent material. For example, the second substrate 310 may include a transparent insulating material such as glass or quartz. The second substrate 310 may be a rigid substrate. However, the present disclosure is not limited to this example. For example, the second substrate 310 may include plastic such as PI and may have a flexible characteristic such as bendability, foldability, or rollability.

The second substrate 310 may be the same as the first substrate 110 or may be different from the first substrate 110 in terms of the material, thickness, and transmittance thereof. For example, the second substrate 310 may have a higher transmittance than the first substrate 110. Since the second substrate 310 includes a material capable of transmitting light therethrough, the second substrate 310 can transmit light emitted from first, second, and third light-emitting areas TA1, TA2, and TA3 therethrough and can thus provide the light to the outside of the display device 1. The second substrate 310 may be thicker or thinner than the first substrate 110.

An upper light-absorbing member UAB may be disposed on the surface of the second substrate 310 that faces the first substrate 110, along the boundaries of each of the subpixels PXS. The upper light-absorbing member UAB may overlap with the pixel-defining film PDL of the display substrate 10 and may be disposed in a light-blocking area BA. The upper light-absorbing member UAB may include openings that expose parts of the surface of the second substrate 310 that overlap with the emission areas EMA. The upper light-absorbing member UAB may block the emission of light from the display device 1 and may suppress the reflection of external light. The upper light-absorbing member UAB may be formed in a lattice shape in a plan view.

The upper light-absorbing member UAB may include an organic material. For example, the upper light-absorbing member UAB may include a light-absorbing material capable of absorbing visible light. For example, the upper light-absorbing member UAB may be formed of a material that can be used as a black matrix. The upper light-absorbing member UAB may be a type of light-blocking member.

For example, the upper light-absorbing member UAB may absorb visible light of a particular wavelength range and may transmit visible light of another particular wavelength range therethrough. For example, the upper light-absorbing member UAB may include the same material as one color filter layer CFL. For example, the upper light-absorbing member UAB may be formed of the same material as a first color filter layer 320, which is a blue filter layer.

A color filter layer CFL may be disposed on the surface of the second substrate 310 where the upper light-absorbing member UAB is disposed. The color filter layer CFL may block the emission of light of colors other than the colors of the subpixels PXS. In addition, the color filter layer CFL may form a dummy pattern DP for forming a spacer CS that will be described later and may control the height of the spacer CS.

The color filter layer CFL may be disposed in light-emitting areas TA and in a spacer area SA in the light-blocking area BA. The spacer area SA may be an area in which the spacer CS is to be disposed.

In the light-emitting areas TA, the color filter layer CFL may be disposed on at least parts of the surface of the second substrate 310, exposed through the openings of the upper light-absorbing member UAB. In addition, the color filter layer CFL may be disposed in part on at least parts of the upper light-absorbing member UAB near the light-emitting areas TA. In the spacer area SA, the color filter layer CFL may be disposed on a surface of the upper light-absorbing member UAB.

The color filter layer CFL may include first, second, and third color filter layers 320, 330, and 340. Each of the first, second, and third color filter layers 320, 330, and 340 may transmit light of a particular color thereof and may thus block or absorb light of a color different from the particular color.

The first color filter layer 320 may include a material that can selectively transmit light of the first color (e.g., blue light) therethrough and can block or absorb light of the third color (e.g., red light). For example, the first color filter layer 320 may be a blue filter layer and may include a blue colorant such as a blue dye or pigment.

The first color filter layer 320 may include a first color filter 321, which is disposed in the first light-emitting area TA1 of the first subpixel PXS1. The first color filter 321 may be disposed on the exposed part of the surface of the second substrate 310 in the first light-emitting area TA1. The first color filter 321 may be disposed in part on at least a part of the upper light-absorbing member UAB near the first light-emitting area TA1. The first color filter 321 may be, for example, a blue filter.

The first color filter layer 320 may further include a first dummy color pattern 322, which is disposed in the spacer area SA. The first dummy color pattern 322 may include the same material as the first color filter 321 and may be formed by the same process as the first color filter 321. For example, the first color filter 321 and the first dummy color pattern 322 may be formed by forming the first color filter layer 320 to be patterned by a single process.

The first dummy color pattern 322 may be disposed on the upper light-absorbing member UAB, in the spacer area SA. The first dummy color pattern 322 may not be disposed in parts of the light-blocking area BA near the spacer area SA. The first dummy color pattern 322 may be disposed to be spaced apart from the first color filter 321.

The first dummy color pattern 322 may be disposed in the spacer area SA to form the dummy pattern DP.

The second color filter layer 330 may include a material that can selectively transmit light of the second color (e.g., green light) therethrough and can block or absorb light of the third color (e.g., red light). For example, the second color filter layer 330 may be a green filter layer and may include a green colorant such as a green dye or pigment.

The second color filter layer 330 may include a second color filter 331, which is disposed in the second light-emitting area TA2 of the second subpixel PXS2. The second color filter 331 may be disposed on the exposed part of the surface of the second substrate 310 in the second light-emitting area TA2. The second color filter 331 may be disposed in part on at least a part of the upper light-absorbing member UAB near the second light-emitting area TA2. The second color filter 331 may be a green filter.

The third color filter layer 340 may include a material that can selectively transmit light of the third color (e.g., red light) therethrough and can block or absorb light of colors different from the third color, for example, light of the first color (e.g., blue light) and light of the second color (e.g., green light). For example, the third color filter layer 340 may be a red filter layer and may include a red colorant such as a red dye or pigment.

The third color filter layer 340 may include a third color filter 341, which is disposed in the third light-emitting area TA3 of the third subpixel PXS3. The third color filter 341 may be disposed on the exposed part of the surface of the second substrate 310 in the third light-emitting area TA3. The third color filter 341 may be disposed in part on at least a part of the upper light-absorbing member UAB near the third light-emitting area TA3. The third color filter 341 may be a red filter.

A first capping layer CPL1 may be disposed on the color filter layer CFL. The first capping layer CPL1 may prevent the color filter layer CFL from being damaged or polluted by impurities such as moisture or the air from the outside of the display device 1. The first capping layer CPL1 may prevent the colorants of the color filter layer CFL from being diffused to other elements.

The first capping layer CPL1 may overlap the color filter layer CFL. For example, the first capping layer CPL1 may be in direct contact with a surface (e.g., the bottom surface in FIG. 4) of the color filter layer CFL. The first capping layer CPL1 may overlap parts of the upper light-absorbing member UAB exposed by the color filter layer CFL. For example, the first capping layer CPL1 may be in direct contact with parts of the surface of the upper light-absorbing member UAB, exposed by the color filter layer CFL.

The first capping layer CPL1 may be formed of an inorganic material. For example, the first capping layer CPL1 may include silicon nitride, aluminum nitride, zirconium nitride, titanium nitride, hafnium nitride, tantalum nitride, silicon oxide, aluminum oxide, titanium oxide, tin oxide, and/or silicon oxynitride.

A light-transmitting layer TPL may be disposed on the first capping layer CPL1 to overlap with the first color filter layer 320. The light-transmitting layer TPL may be patterned to be disposed in the first light-emitting area TA1 and the spacer area SA of the light-blocking area BA.

The light-transmitting layer TPL may include a first base resin BRS1 and a first scatterer SCP1, which is dispersed in the first base resin BRS1.

The first base resin BRS1 may include a material with a relatively high light transmittance. The first base resin BRS1 may be formed of a transparent organic material. For example, the first base resin BRS1 may include at least one of an epoxy resin, an acrylic resin, a cardo resin, and/or an imide resin.

The first scatterer SCP1 may have a refractive index different from the first base resin BRS1 and may form an optical interface with the first base resin BRS. The first scatterer SCP1 may include light-scattering particles that scatter at least some light. For example, the first scatterer SCP1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$) or organic particles such as particles of an acrylic resin or a urethane resin. The first scatterer SCP1 may scatter light in random directions regardless of the incident direction of the light without substantially changing the peak wavelength of the light.

The light-transmitting layer TPL may include a light-transmitting pattern TPL_1, which is disposed in the first light-emitting area TA1, and a light-transmitting dummy pattern TPL_2, which is disposed in the spacer area SA. The light-transmitting pattern TPL_1 may be disposed on the first color filter 321, in the first light-emitting area TAL. The light-transmitting dummy pattern TPL_2 may be disposed on the first dummy color pattern 322, in the spacer area SA of the light-blocking area BA. The light-transmitting pattern TPL_1 and the light-transmitting dummy pattern TPL_2 may be disposed to be spaced apart from each other. For example, the light-transmitting pattern TPL_1 and the light-transmitting dummy pattern TPL_2 may include the same material and may be formed to be patterned by a single process. For example, the light-transmitting layer TPL may be formed by applying a photosensitive material and subjecting the photosensitive material to exposure and development processes. However, the present invention is not limited thereto.

The light-transmitting pattern TPL_1 may overlap with the first color filter 321, which is disposed in the first light-emitting area TA1, in the third direction DR3. The light-transmitting pattern TPL_1 may transmit therethrough light incident thereupon from the display substrate 10 while maintaining the wavelength of the incident light. The first scatterer SCP1 of the light-transmitting pattern TPL_1 may control the emission angle of light to be emitted from the light-transmitting pattern TPL_1 by scattering light. For example, first-color light emitted from a first emission area EMA1 may be emitted out of the display device 1 as the first-color light through the light-transmitting pattern TPL_1 and the first color filter 321. Here, the first-color light may be blue light.

The light-transmitting dummy pattern TPL_2 may overlap with the first dummy color pattern 322, which is disposed in the spacer area SA, in the third direction DR3. For example, the sidewalls of the light-transmitting dummy pattern TPL_2 may be aligned with the sidewalls of the first dummy color pattern 322, but the present invention is not limited thereto. In addition, the sidewalls of the light-transmitting dummy pattern TPL_2 may be arranged on the inside of the sidewalls of the first dummy color pattern 322 to expose at least parts of a surface of the light-transmitting dummy pattern TPL_2.

The light-transmitting dummy pattern TPL_2 may form the dummy pattern DP together with the first dummy color pattern 322. The dummy pattern DP may protrude from the surface (e.g., the bottom surface in FIG. 4) of the second substrate 310. The dummy pattern DP may form a height difference with regard to the surface of a bank layer 370 and may thus contribute to the formation of the spacer CS and the control of the height of the spacer CS during the formation of the bank layer 370 in the light-blocking area BA.

A second capping layer CPL2 is disposed on the light-transmitting layer TPL. The second capping layer CPL2 may be formed of an inorganic material. The second capping layer CPL2 may include at least one from among the aforementioned materials that can be used to form the first capping layer CPL. For example, the second capping layer CPL2 may be formed of the same material as the first capping layer CPL1, but the present invention is not limited thereto.

The second capping layer CPL2 may cover the light-transmitting layer TPL. The second capping layer CPL2 may cover not only the bottom surface, but also the side surfaces, of each of the light-transmitting pattern TPL_1 and the light-transmitting dummy pattern TPL_2. For example, the second capping layer CPL2 may be in contact with the first capping layer CPL1. For example, the second capping layer CPL2 may not be in contact with the first capping layer CPL1 in the first light-emitting area TA1 and the spacer area SA. As another example, the second capping layer CPL2 may not be in contact with the first capping layer CPL1 when the second capping layer CPL2 contacts the light transmitting dummy pattern TPL_2. The second capping layer CPL2 may have a conformal shape to height differences formed by the light-transmitting pattern TPL_1 and the light-transmitting dummy pattern TPL_2. The gap between the light-transmitting pattern TPL_1 and the light-transmitting dummy pattern TPL_2 may not be completely filled with the second capping layer CPL2, but may have a predetermined depth.

The wavelength conversion layer WCL is disposed on the second capping layer CPL2. The wavelength conversion layer WCL may include a first wavelength conversion pattern WCL1, which is disposed in the second light-emitting area TA2 of the second subpixel PXS2, and a second wavelength conversion pattern WCL2, which is disposed in the third light-emitting area TA3 of the third subpixel PXS3.

The first wavelength conversion pattern WCL1 may include a second base resin BRS2 and a first wavelength conversion material WCP1, which is dispersed in the second base resin BRS2. The first wavelength conversion pattern WCL1 may further include a second scatterer SCP2, which is dispersed in the second base resin BRS2. The second wavelength conversion pattern WCL2 may include a third base resin BRS3 and a second wavelength conversion material WCP2, which is dispersed in the third base resin BRS3. The second wavelength conversion pattern WCL2 may further include a third scatterer SCP3, which is dispersed in the third base resin BRS3.

The second and third base resins BRS2 and BRS3 may include a material with a relatively high light transmittance. The second and third base resins BRS2 and BRS3 may be formed of a transparent organic material. For example, the second and third base resins BRS2 and BRS3 may be formed of the same material as the first base resin BRS1 or may include at least one of the aforementioned materials that can be used to form the first base resin BRS1. The first, second, and third base resins BRS1, BRS2, and BRS3 may include the same material, but the present invention is not limited thereto. For example, the first, second and third base resins BRS1, BRS2 and BRS3 may each be formed of a different material from each other.

The second and third scatterers SCP2 and SCP3 may be metal oxide particles or organic particles. The second and third scatterers SCP2 and SCP3 may include light-scattering particles that scatter at least some light. For example, the second and third scatterers SCP2 and SCP3 may be formed of the same material as the first scatterer SCP1 or may include at least one of the aforementioned materials that can be used to form the first scatterer SCP1. For example, the first, second and third scatterers SCP1, SCP2 and SCP3 may each be formed of a different material from each other.

The first wavelength conversion material WCP1 may include a material that converts first-color light into second-color light, and the second wavelength conversion material WCP2 may include a material that converts first-color light into third-color light. For example, the first wavelength conversion material WCP1 may be a material that converts blue light into green light, and the second wavelength conversion material WCP2 may be a material that converts blue light into red light. For example, the first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof.

The first wavelength conversion pattern WCL1 may overlap with the second color filter 331, which is disposed in the second light-emitting area TA2, in the third direction DR3. The first wavelength conversion pattern WCL1 may convert first-color light incident thereupon from the display substrate 10 into second-color light. For example, first-color light emitted from a second emission area EMA2 may be emitted out of the display device 1 as second-color light through the first wavelength conversion pattern WCL1 and the second color filter 331. Here, the second-color light may be green light.

The second wavelength conversion pattern WCL2 may overlap with the third color filter 341, which is disposed in the third light-emitting area TA3, in the third direction DR3. The second wavelength conversion pattern WCL2 may convert first-color light incident thereupon from the display substrate 10 into third-color light. For example, first-color light emitted from a third emission area EMA3 may be emitted out of the display device 1 as third-color light through the second wavelength conversion pattern WCL2 and the third color filter 341. Here, the third-color light may be red light.

The wavelength conversion layer WCL or the light-transmitting pattern TPL_1 of the light-transmitting layer TPL may be disposed to be separated from each other based on their corresponding subpixels PXS. The first wavelength conversion pattern WCL1, the second wavelength conversion pattern WCL2, the light-transmitting pattern TPL_1, and the light-transmitting dummy pattern TPL_2 may be disposed in the same pixel PX to be spaced apart from one another. The gaps between the first wavelength conversion pattern WCL1, the second wavelength conversion pattern WCL2, the light-transmitting pattern TPL_1, and the light-transmitting dummy pattern TPL_2 may generally overlap with the light-blocking area BA except for the spacer area SA. For example, the gaps between the first wavelength conversion pattern WCL1, the second wavelength conversion pattern WCL2, the light-transmitting pattern TPL_1, and the light-transmitting dummy pattern TPL_2 may form valleys.

The bank layer 370 may be disposed on the second capping layer CPL2. The bank layer 370 may be disposed in the light-blocking area BA, along the boundaries of each of the subpixels PXS. The bank layer 370 may overlap with the upper light-absorbing member UAB and/or the pixel-defining film PDL. For example, the bank layer 370 may be formed in a lattice shape from a plan view.

The bank layer 370 may be formed of a material capable of blocking the transmission of light therethrough and may prevent light from one subpixel PXS from infiltrating into other neighboring subpixels PXS and thereby causing color mixing. In a case where the wavelength conversion layer WCL is formed via, for example, inkjet printing, the bank layer 370 may serve as a barrier for guiding an ink composition to be stably sprayed onto each desired location during the formation of the wavelength conversion layer WCL.

The bank layer 370 may include a spacer part 372, which is disposed in the spacer area SA of the light-blocking area BA, and a bank part 371, which is disposed in the entire light-blocking area BA except for the spacer area SA. The bank part 371 may account for portions of the bank layer 370 that are disposed in the gaps between the first wavelength conversion pattern WCL1, the second wavelength conversion pattern WCL2, the light-transmitting pattern TPL_1, and the light-transmitting dummy pattern TPL_2 that form valleys.

The bank layer 370 may have a height difference on the surface thereof. For example, the height difference of the bank layer 370 may be due to the presence of an upper structure disposed on the bank layer 370. The surface shape of the bank layer 370 may conform to the upper structure. For example, the bank layer 370 may protrude downwardly from the second substrate 310 toward the display substrate 10 due to the dummy pattern DP, which is disposed on the bank layer 370, in the spacer area SA.

The bank layer 370 may include a spacer part 372 with a first height and a bank part 371 with a second height, which is smaller than the first height. The height of the bank layer 370 may be measured from a reference surface such as the surface (e.g., the bottom surface) of the second substrate 310.

As already mentioned above, the spacer part 372 may be disposed in the spacer area SA to overlap with the dummy pattern DP. The bank part 371 may be disposed in the light-blocking area BA except for the spacer area SA and may not overlap with the dummy pattern DP. For example, the bank part 371 may be disposed in the entire light-blocking area BA. The height of the surface (e.g., the bottom surface in FIG. 4) of the spacer part 372 may be greater than the height of the surface (e.g., the bottom surface in FIG. 4) of the bank part 371 with respect to the second substrate 310. The surface of the spacer part 372 may protrude from the surface of the bank part 371 by as much as the thickness of the dummy pattern DP.

Due to the dummy pattern DP, which protrudes from the surface of the second substrate 310, the bank layer 370 may be divided into the bank part 371 and the spacer part 372, which is physically connected to the bank part 371 and protrudes downwardly from the bank part 371, in the spacer area SA and parts of the light-blocking area BA adjacent to the spacer area SA. Due to the bank part 371 and the spacer part 371 having different heights, the bank layer 370 may have a height difference in the spacer area SA and parts of the light-blocking area BA adjacent to the spacer area SA. The spacer part 372, which protrudes due to the dummy pattern DP including the first dummy color pattern 322 and the light-transmitting dummy pattern TPL_2, may form the spacer CS together with the dummy pattern DP.

The spacer CS may maintain the distance to a structure disposed thereabove. For example, the spacer CS may maintain the cell gap or distance between the display substrate 10 and the color conversion substrate 30. Thus, since the spacer CS is disposed between the display substrate 10 and the second substrate 310 of the color conversion substrate 30 to maintain the distance between the display substrate 10 and the color conversion substrate 30, the design of the viscosity and/or the rigidity of the filling layer 70 may not be needed to maintain the distance between the display substrate 10 and the color conversion substrate 30. Thus, the amount of time that it takes to fabricate the display device 1 can be shortened, and the design of the filling layer 70 can be facilitated.

The bank part 371 may be disposed between the light-transmitting pattern TPL_1 and the first wavelength conversion pattern WCL1, between the first wavelength conversion pattern WCL1 and the second wavelength conversion pattern WCL2, and between the second wavelength conversion pattern WCL2 and the light-transmitting pattern TPL_1. In addition, the bank part 371 may be disposed between the light-transmitting pattern TPL_1 and the light-transmitting dummy pattern TPL_2. Portions of the bank part 371 near the spacer area SA may be integrally formed with, and physically connected to, the spacer part 372.

A portion of the bank part 371 disposed between the light-transmitting pattern TPL_1 and the first wavelength conversion pattern WCL1 may overlap with part of the light-transmitting pattern TPL_1, near the light-transmitting pattern TPL_1. One side surface and the bottom surface of the portion of the bank part 371 near the light-transmitting pattern TPL_1 may be in direct contact with part of the second capping layer CPL_2 that covers a side surface of the light-transmitting pattern TPL_1. The other side surface of the portion of the bank part 371 near the light-transmitting pattern TPL_1 may be in direct contact with a side surface of the first wavelength conversion pattern WCL1.

Both side surfaces of a portion of the bank part 371 disposed between the first and second wavelength conversion patterns WCL1 and WCL2 may be disposed on side surfaces of the first and second wavelength conversion patterns WCL1 and WCL2. For example, both side surfaces of a portion of the bank part 371 disposed between the first and second wavelength conversion patterns WCL1 and WCL2 may be in direct contact with side surfaces of the first and second wavelength conversion patterns WCL1 and WCL2. The bottom surface of the portion of the bank part 371 disposed between the first and second wavelength conversion patterns WCL1 and WCL2 may be disposed on the second capping layer CPL2. For example, the bottom surface of the portion of the bank part 371 disposed between the first and second wavelength conversion patterns WCL1 and WCL2 may be in direct contact with the second capping layer CPL2.

A side surface of a portion of the bank part 371 disposed between the second wavelength conversion pattern WCL2 and the light-transmitting pattern TPL_1 may be disposed on a side surface of the second wavelength conversion pattern WCL2. For example, a side surface of a portion of the bank part 371 disposed between the second wavelength conversion pattern WCL2 and the light-transmitting pattern TPL_1 may be in direct contact with a side surface of the second wavelength conversion pattern WCL2. Although not specifically illustrated, the bottom surface and the other side surface of the portion of the bank pan 371 disposed between the second wavelength conversion pattern WCL2 and the light-transmitting pattern TPL_1 may be disposed on part of the second capping layer CPL2 that covers a side surface of the light-transmitting pattern TPL_1. For example, the bottom surface and the other side surface of the portion of the bank part 371 disposed between the second wavelength conversion pattern WCL2 and the light-transmitting pattern TPL_1 may be in direct contact with a part of the second capping layer CPL2 that covers a side surface of the light-transmitting pattern TPL_1.

The bank part 371 may prevent light from one subpixel PXS from infiltrating into other neighboring subpixels PXS and thereby causing color mixing.

A third capping layer CPL3 may be disposed on the wavelength conversion layer WCL, the light-transmitting pattern TPL_1, and the bank layer 370. The third capping layer CPL3 may be disposed on the surface of the color conversion substrate 30 to cover the wavelength conversion layer WCL, the light-transmitting pattern TPL_1, and the bank layer 370. For example, the third capping layer CPL3 may be disposed on the entire surface of the color conversion substrate 30. For example, the third capping layer CPL3 may seal the first wavelength conversion pattern WCL1, the second wavelength conversion pattern WCL2, the light-transmitting pattern TPL_1, and the bank layer 370 to prevent damage to, or pollution of, the first wavelength conversion pattern WCL1, the second wavelength conversion pattern WCL2, the light-transmitting pattern TPL_1, and the bank layer 370.

The third capping layer CPL3 may be disposed on the second capping layer CPL2, the first and second wavelength conversion patterns WCL1 and WCL2, and the bank layer 370. For example, the third capping layer CPL3 may be in direct contact with the second capping layer CPL2, in the first light-emitting area TA1, in direct contact with the surfaces (e.g., the bottom surfaces in FIG. 4) of the first and second wavelength conversion patterns WCL1 and WCL2, in the second and third light-emitting areas TA2 and TA3, and in direct contact with the surface (e.g., the bottom surface in FIG. 4) of the bank layer 370, in the light-blocking area BA. In addition, the third capping layer CPL3 may be disposed on the second inorganic film 123 of the thin-film encapsulation structure 120 of the display substrate 10, in the spacer area SA. For example, the third capping layer CPL3 may be in contact with the second inorganic film 123 in the spacer area SA The third capping layer CPL3 may be formed of the same material as the first or second capping layer CPL1 or CPL2 or may include one of the aforementioned materials that can be used to form the first or second capping layer CPL1 or CPL2.

The filling layer 70 may be disposed between the display substrate 10 and the color conversion substrate 30. The filling layer 70 may fill the gap between the display substrate 10 and the color conversion substrate 30 and may couple the display substrate 10 and the color conversion substrate 30 together. The filling layer 70 may be formed of, for example, a Si-based organic material or an epoxy-based organic material, but the present invention is not limited thereto.

The filling layer 70 may be disposed between the thin-film encapsulation structure 120 of the display substrate 10 and the third capping layer CPL3 of the color conversion substrate 30. The filling layer 70 may not be disposed in an area that overlaps with the spacer area SA.

The distance between the display substrate 10 and the color conversion substrate 30 can be maintained by the spacer CS of the color conversion substrate 30 without the need to additionally design the viscosity and/or the rigidity of the filling layer 70. Thus, the thickness of the display device 1 can be uniformly maintained as compared to a case where the distance between the display substrate 10 and the color conversion substrate 30 is controlled simply with the use of the filling layer 70. Therefore, any smudges that may be generated when the distance between the display substrate 10 and the color conversion substrate 30 is not uniform can be reduced.

Figure 5:
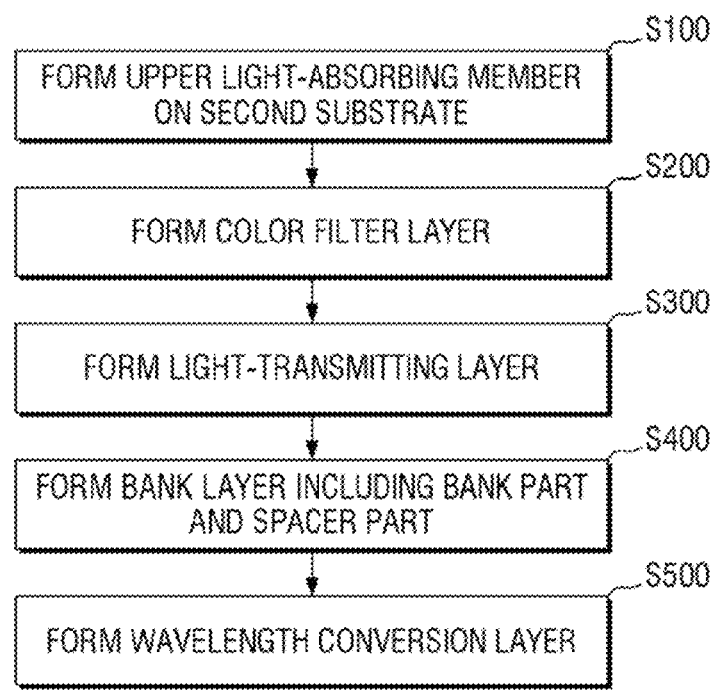
FIG. 5 is a flowchart illustrating a method of fabricating a color conversion substrate of a display device according to an exemplary embodiment of the present invention.

FIG. 5 is a flowchart illustrating a method of fabricating a color conversion substrate of a display device according to an exemplary embodiment of the present invention. FIGS. 6 through 11 are cross-sectional views illustrating steps of a method of fabricating the display device of FIG. 4.

Referring to FIG. 5, a method of fabricating a color conversion substrate 30 of a display device 1 may include the following: forming an upper light-absorbing member UAB on a second substrate 310 (S100); forming a color filter layer CFL (S200); forming a light-transmitting layer TPL (S300); forming a bank layer 370, which includes a bank part 371 and a spacer part 372 (S400); and forming a wavelength conversion layer WCL (S500).

The upper light-absorbing member UAB is formed on the second substrate 310 (S100).

Figure 6:
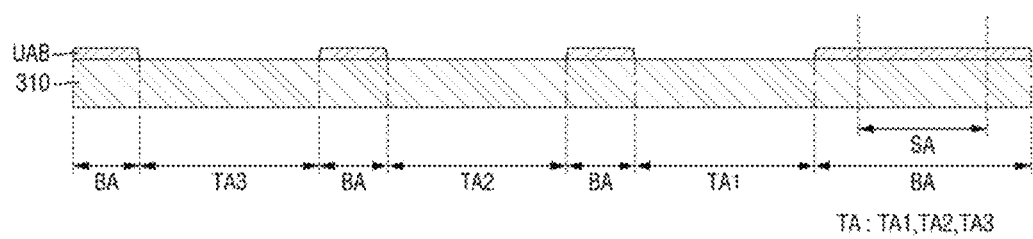
FIGS. 6, 7, 8, 9, 10 and 11 are cross-sectional views illustrating steps of a method of fabricating a display device according to an exemplary embodiment of the present invention.

Referring to FIG. 6, the upper light-absorbing member UAB, which is patterned, may be formed on a surface of the second substrate 310. The upper light-absorbing member UAB may be disposed in a light-blocking area BA. The upper light-absorbing member UAB, which is patterned, may be formed by a coating process and/or an exposure process. For example, the upper light-absorbing member UAB, which is patterned, may include an organic light-absorbing material and may be formed by formed by coating the organic light-absorbing material and subjecting the organic light-absorbing material to an exposure process.

Thereafter, referring again to FIG. 5, the color filter layer CFL is formed on the surface of the second substrate 310 where the upper light-absorbing member UAB is formed (S200).

Figure 7:
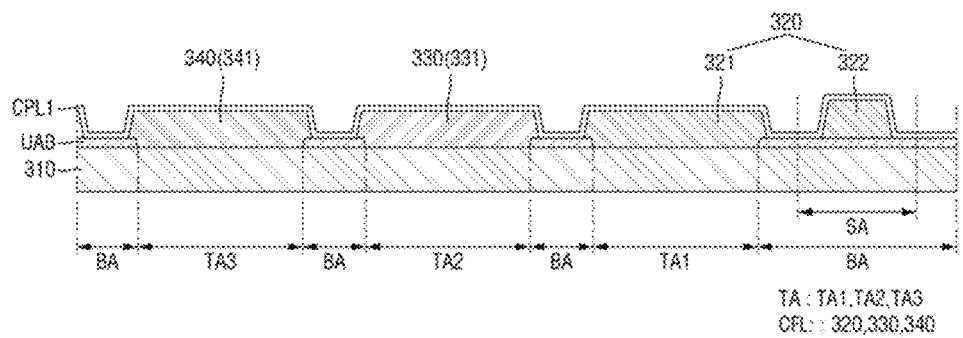

Referring to FIG. 7, the color filter layer CFL, which is patterned, is formed on the surface of the second substrate 310 and may overlap at least portions of the upper light-absorbing member UAB. The color filter layer CFL may include first, second, and third color filter layers 320, 330, and 340. Each of the first, second, and third color filter layers 320, 330, and 340 may be formed by applying a photosensitive organic material including a predetermined color colorant and subjecting the photosensitive organic material to exposure and development processes.

For example, the first color filter layer 320, which is patterned, may be formed by applying a photosensitive organic material including a first-color colorant and subjecting the photosensitive organic material to exposure and development processes. For example, the first color filter layer 320 may be formed by applying a photosensitive organic material including a blue colorant and subjecting the photosensitive organic material to exposure and development processes. The first color filter layer 320, which is patterned, may include a first color filter 321, which is disposed in a first light-emitting area TA1, and a first dummy color pattern 322, which is disposed in a spacer area SA.

Similarly, the second color filter layer 330, which is patterned, may be formed by applying a photosensitive organic material including a second-color colorant and subjecting the photosensitive organic material to exposure and development processes. The third color filter layer 340, which is patterned, may be formed by applying a photosensitive organic material including a third-color colorant and subjecting the photosensitive organic material to exposure and development processes. For example, the second color filter layer 330 may be formed by applying a photosensitive organic material including a green colorant and subjecting the photosensitive organic material to exposure and development processes. For example, the third color filter layer 340 may be formed by applying a photosensitive organic material including a red colorant and subjecting the photosensitive organic material to exposure and development processes. The second color filter layer 330, which is patterned, may include a second color filter 331, which is disposed in a second light-emitting area TA2, and the third color filter layer 340, which is patterned, may include a third color filter 341, which is disposed in a third light-emitting area TA3. Thereafter, a first capping layer CPL1, which covers the color filter layer CFL and the upper light-absorbing member UAB, is formed.

Thereafter, referring again to FIG. 5, the light-transmitting layer TPL is formed on the first color filter layer 320 (S300).

Figure 8:
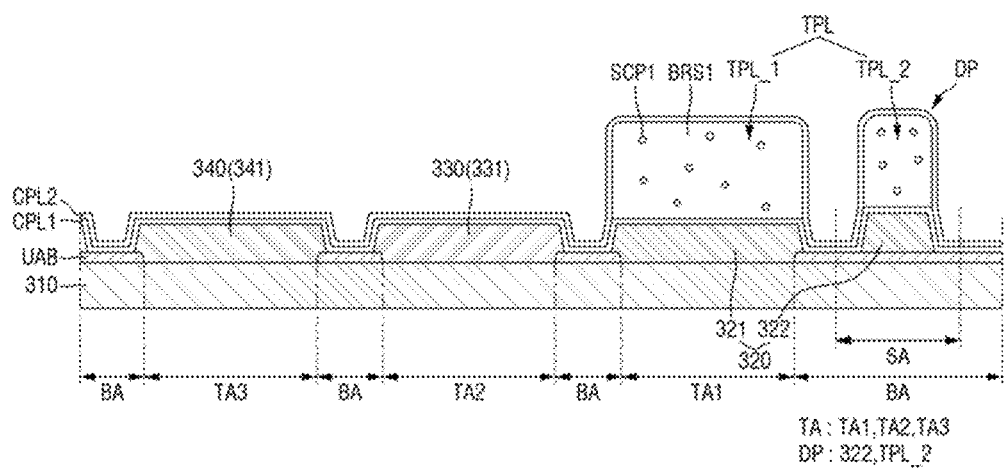

Referring to FIG. 8, the light-transmitting layer TPL, which is patterned, is formed on the surface of the second substrate 310 and overlaps the color filter layer CFL. The light-transmitting layer TPL may be formed by applying a photosensitive material and subjecting the photosensitive material to exposure and development processes. For example, the light-transmitting layer TPL may be formed on the first color filter layer 320 by applying a photosensitive material and subjecting the photosensitive material to exposure and development processes. The light-transmitting layer TPL, which is patterned, may include a light-transmitting pattern TPL_1, which is disposed on the first color filter 321, and a light-transmitting dummy pattern TPL_2, which is disposed on the first dummy color pattern 322.

The first dummy color pattern 322 and the light-transmitting dummy pattern TPL_2 may form a dummy pattern DP, which provides a height difference for forming a spacer CS in the spacer area SA with the use of the bank layer 370.

Since the light-transmitting layer TPL is formed by exposing and developing a photosensitive material before the formation of the wavelength conversion layer WCL, the provision of inkjet nozzles or the preparation of ink may not be needed to form the light-transmitting layer TPL during an inkjet printing process for forming the wavelength conversion layer WCL. Thus, the amount of time and expense for forming the light-transmitting layer TPL can be reduced.

Thereafter, referring again to FIG. 5, the bank layer 370, which includes the bank part 371 and the spacer part 372, is formed (S400).

Figure 9:
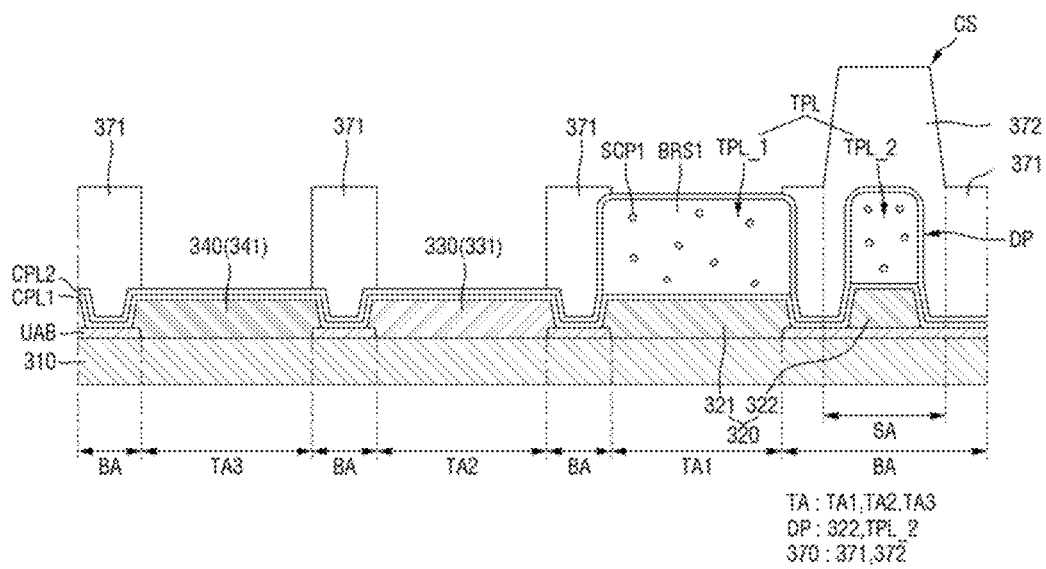

Referring to FIG. 9, a second capping layer CPL2 may be formed on the surface of the second substrate 310 where the light-transmitting layer TPL is formed, and the bank layer 370, which is patterned, may be formed on the second capping layer CPL2. The bank layer 370 may be disposed in the light-blocking area BA. For example, the bank layer 370, which is patterned 370, may be formed by an exposure process. For example, the bank layer 370 may include an organic material, and the organic material may be a photosensitive organic material. In this example, the bank layer 370, which is patterned, may be formed by applying an organic material layer for forming the bank layer 370 and subjecting the organic material layer to exposure and development processes. The organic material layer may be a layer of a negative photosensitive material that is cured by being irradiated with light, but the present invention is not limited thereto.

The bank layer 370, which is formed along the boundaries of each subpixel PXS, for example, in the light-blocking area BA. The arrangement and the shape of the bank layer 370, which is patterned, are as already described above. Part of the bank layer 370 disposed in the spacer area SA, e.g., the spacer part 372, may be disposed to overlap with the dummy pattern DP. By forming the bank layer 370, which is patterned, a protruding structure that is to be projected in the spacer area SA by the height difference formed by the dummy pattern DP, e.g., the spacer CS, may be formed.

Referring again to FIG. 5, the wavelength conversion layer WCL is formed (S500).

Figure 10:
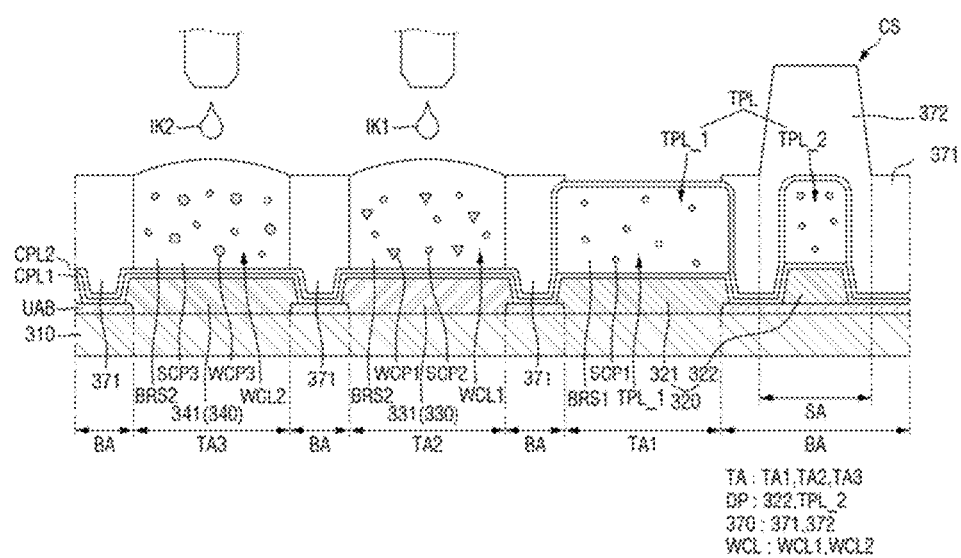

Referring to FIG. 10, the wavelength conversion layer WCL is formed on the second substrate 310 where the bank layer 370, which is patterned, is formed. The wavelength conversion layer WCL may include a first wavelength conversion pattern WCL1, which is disposed in the second light-emitting area TA2, and a second wavelength conversion pattern WCL2, which is disposed in the third light-emitting area TA3. For example, the first and second wavelength conversion patterns WCL1 and WCL2 may be formed by an inkjet printing process using an inkjet composition.

For example, the first wavelength conversion pattern WCL1 may be formed by spraying first ink IK1 including a material for forming the first wavelength conversion pattern WCL1 to the second light-emitting area TA2. The first ink IK1 may be sprayed into a space provided by the bank part 371, in an area that overlaps with the second light-emitting area TA2. For example, the bank part 371 may serve as a guide for allowing the first ink IK1 to be stably placed at a desired location to form the first wavelength conversion pattern WCL1.

Similarly, the second wavelength conversion pattern WCL2 may be formed by spraying second ink IK2 including a material for forming the second wavelength conversion pattern WCL2 to the third light-emitting area TA3. The second ink IK2 may be sprayed into a space provided by the bank part 371, in an area that overlaps with the third light-emitting area TA3. For example, the bank part 371 may serve as a guide for allowing the second ink IK2 to be stably placed at a desired location to form the second wavelength conversion pattern WCL2.

The amount in which to spray the first ink IK1 and the second ink IK2 may be determined in consideration of the surface tensions of the first ink IK1 and the second ink IK2 and the amounts by which the volumes of the first ink IK1 and the second ink 1K2 are reduced when the first ink IK1 and the second ink IK2 are dried.

Figure 11:
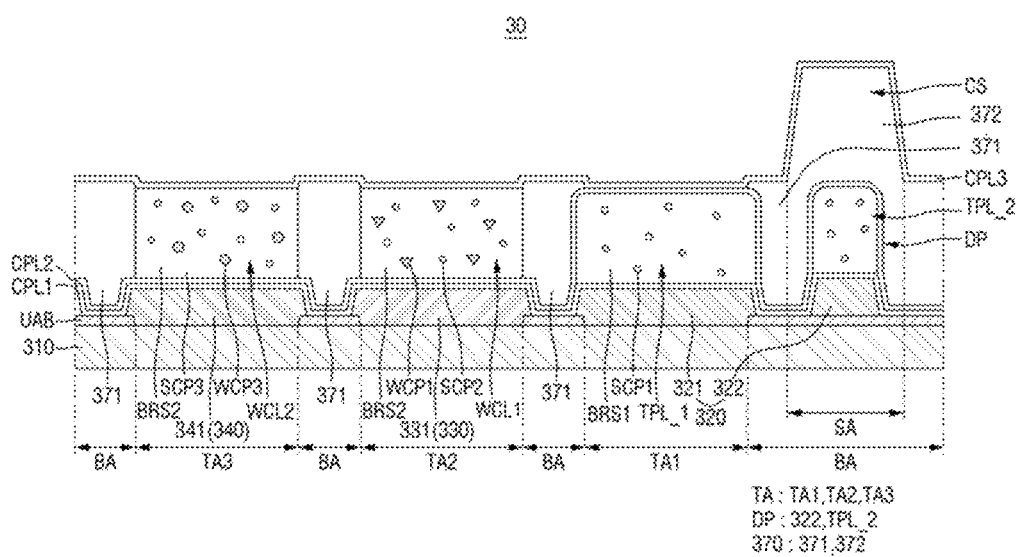

Thereafter, referring to FIG. 11, the wavelength conversion layer WCL is cured, and the third capping layer CPL3 is formed. For example, in a case where the first and second wavelength conversion patterns WCL1 and WCL2 are formed by spraying ink via inkjet printing and curing the ink, the first ink IK1, which is disposed in the second light-emitting area TA2, and the second ink IK2, which is disposed in the third light-emitting area TA3, may be contracted, as illustrated in FIG. 11. The third capping layer CPL3 may be formed along the surface of the color conversion substrate 30. For example, the third capping layer CPL3 may be formed along the entire surface of the color conversion substrate 30.

During the formation of the color filter layer CFL, which is patterned, and the light-transmitting layer TPL, which is patterned, the dummy pattern DP may be formed in the spacer area SA of the light-blocking area BA. The spacer CS may be formed in the process of forming the bank layer 370 by the dummy pattern DP, which protrudes from the surface of the second substrate 310. Thus, since an additional mask process for forming the spacer CS may not be used, process efficiency can be increased.

Exemplary embodiments of the present invention will hereinafter be described, focusing mainly on the differences with the aforementioned embodiments. Descriptions of elements that have already been described will be omitted or simplified.

Figure 12:
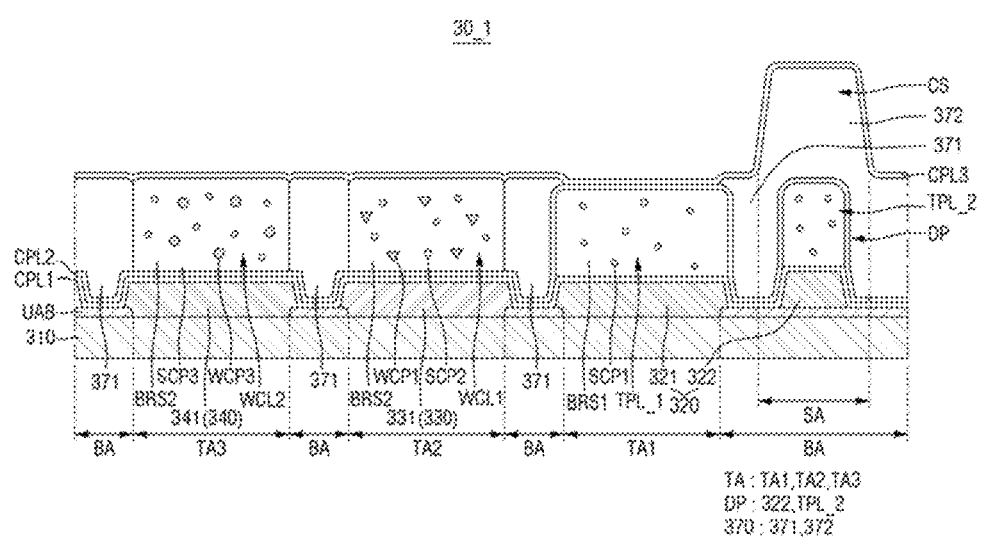
FIG. 12 is a cross-sectional view of a color conversion substrate of a display device according to an exemplary embodiment of the present invention.

FIG. 12 is a cross-sectional view of a color conversion substrate of a display device according to an exemplary embodiment of the present invention.

Referring to FIGS. 5 and 12, a color conversion substrate 30_1 differs from the color conversion substrate 30 in that in S500, first and second wavelength conversion patterns WCL1 and WCL2 are each formed by applying a photosensitive material and subjecting the photosensitive material to exposure and development processes. For example, the first wavelength conversion pattern WCL1 may be formed on a second color filter 331 by applying a photosensitive material for forming the first wavelength conversion pattern WCL1 and subjecting the photosensitive material to exposure and development processes, and the second wavelength conversion pattern WCL2 may be formed on a third color filter 341 by applying a photosensitive material for forming the second wavelength conversion pattern WCL2 and subjecting the photosensitive material to exposure and development processes.

For example, a wavelength conversion layer WCL may be formed by forming a bank layer 370 in a light-blocking area BA and then subjecting a photosensitive material for forming a wavelength conversion pattern in each of second and third light-emitting areas TA2 and TA2 to an exposure process.

Figure 13:
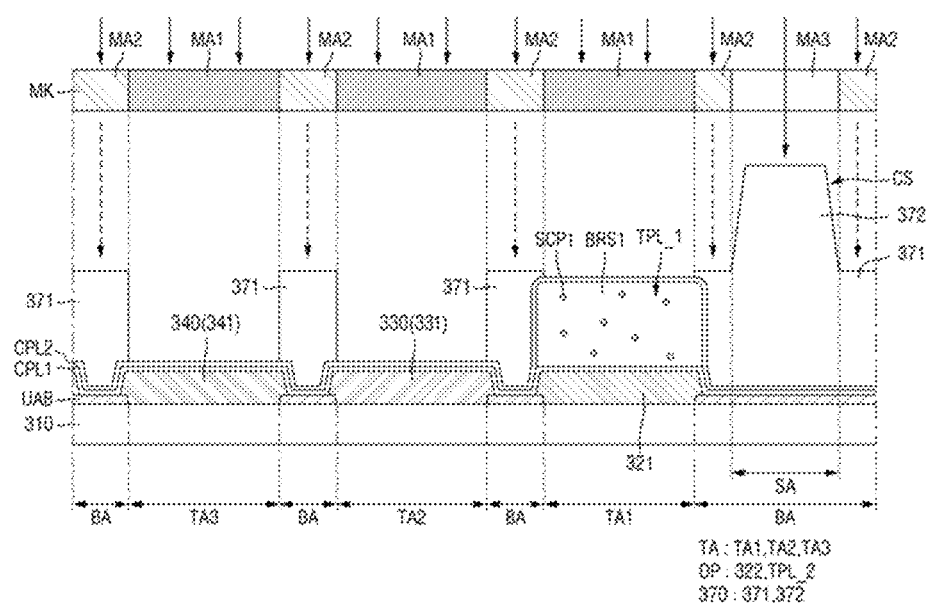
FIGS. 13 and 14 are cross-sectional views illustrating a method of fabricating a color conversion substrate of a display device according to an exemplary embodiment of the present invention.
Figure 14:
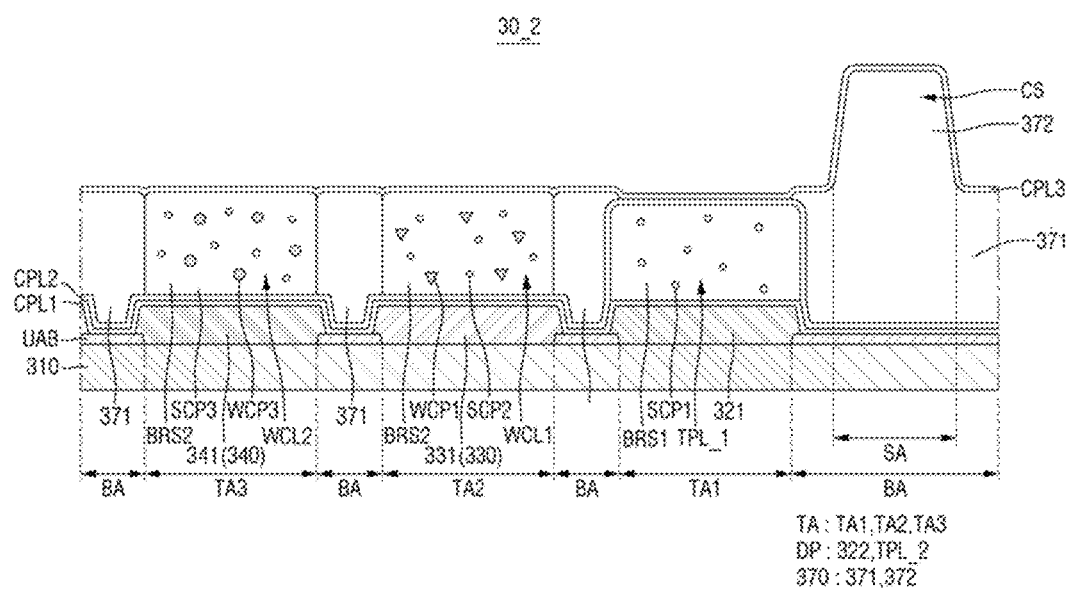

FIGS. 13 and 14 are cross-sectional views illustrating a method of fabricating a color conversion substrate of a display device according to an exemplary embodiment of the present invention.

Referring to FIGS. 13 and 14, a color conversion substrate 30_2 differs from the color conversion substrate 30 of FIG. 4 in that a dummy pattern DP is not disposed in a spacer area SA where a spacer part 372, which forms a spacer CS, is disposed.

As already mentioned above, the spacer pan 372, like a bank part 371 of a bank layer 370, may include an organic insulating material. For example, the bank part 371 and the spacer part 372 may be integrally formed of the same material via a single process. The bank part 371 and the spacer part 372, which have different heights, may be formed by a single process that applies an organic material layer for forming the bank layer 370 and exposes and develops the organic material layer with the use of a slit mask or a multitone mask (or a halftone mask). The organic material layer may include a negative photosensitive material.

Referring to FIG. 13, the bank layer 370 in an entire light-blocking area BA except for the spacer area SA, and in light-emitting areas TA may be formed via a single mask process. For example, a photomask MK is placed on a surface of a second substrate 310. The photomask MK may be a multitone mask (or, e.g., a slit mask or a halftone mask). The photomask MK may include first areas MA1, which do not transmit light therethrough, a second area MA2, which transmits light therethrough in a halftone manner, and a third area MA3, which transmits light therethrough in a full-tone manner.

The photomask MK is arranged so that the first areas MA1, the second area MA2, and the third area MA3 correspond to the light-transmitting areas TA, the entire light-blocking area BA except for the spacer area SA, and the spacer area SA, respectively.

Thereafter, as the organic material layer is exposed and developed using the photomask MK, parts of the organic material layer that correspond to the first areas MA1 may be completely removed to expose the second and third color filters 331 and 341, and parts of the organic material layer that correspond to the second and third areas MA2 and MA3 may remain unremoved. Here, since the amount of exposure of the organic material layer is smaller in the second area MA2 than in the third area MA3, the thickness of the organic material layer may be smaller in the second area MA2 than in the third area MA3. Thus, part of the bank layer 370 disposed in the spacer area SA, e.g., the spacer part 372, may be thicker than part of the bank layer 370 not disposed in the spacer area SA, e.g., the bank part 371. By forming the bank layer 370 in this manner, the spacer CS, which protrudes from the second substrate 310, may be formed in the spacer area SA.

Even in a case where a dummy pattern DP is not formed in the spacer area SA with the use of a color filter layer CFL and a light-transmitting layer TPL, the spacer CS can be formed by forming the bank layer 370, which is patterned to have different thicknesses in the spacer area SA and in the rest of the light-blocking area BA, with the use of the photomask MK.

The bank layer 370 may include a negative photosensitive material, but the present invention is not limited thereto. In addition, the bank layer 370 may include a positive photosensitive material, in which case, the first areas MA1 and the third area MA3 of the photomask MK may be reversed.

Thereafter, first and second wavelength conversion patterns WCL1 and WCl2 may be formed in the second and third light-emitting areas TA2 and TA3, respectively. The first and second wavelength conversion patterns WCL1 and WCL2 may be formed by an inkjet printing process using an inkjet composition, but the present invention is not limited thereto. Each of the first and second wavelength conversion patterns WCL1 and WCL2 may be formed by applying a photosensitive material and subjecting the photosensitive material to exposure and development processes.

Dummy patterns of display devices according to an exemplary embodiment of the present invention, which form spacers in spacer areas, will hereinafter be described with reference to FIGS. 15 through 17. The exemplary embodiments of FIGS. 15 through 17 differ from the exemplary embodiment of FIG. 14 in that a dummy pattern that forms a spacer is formed by more than one color filter layer or a color filter layer other than a first color filter layer.

Figure 15:
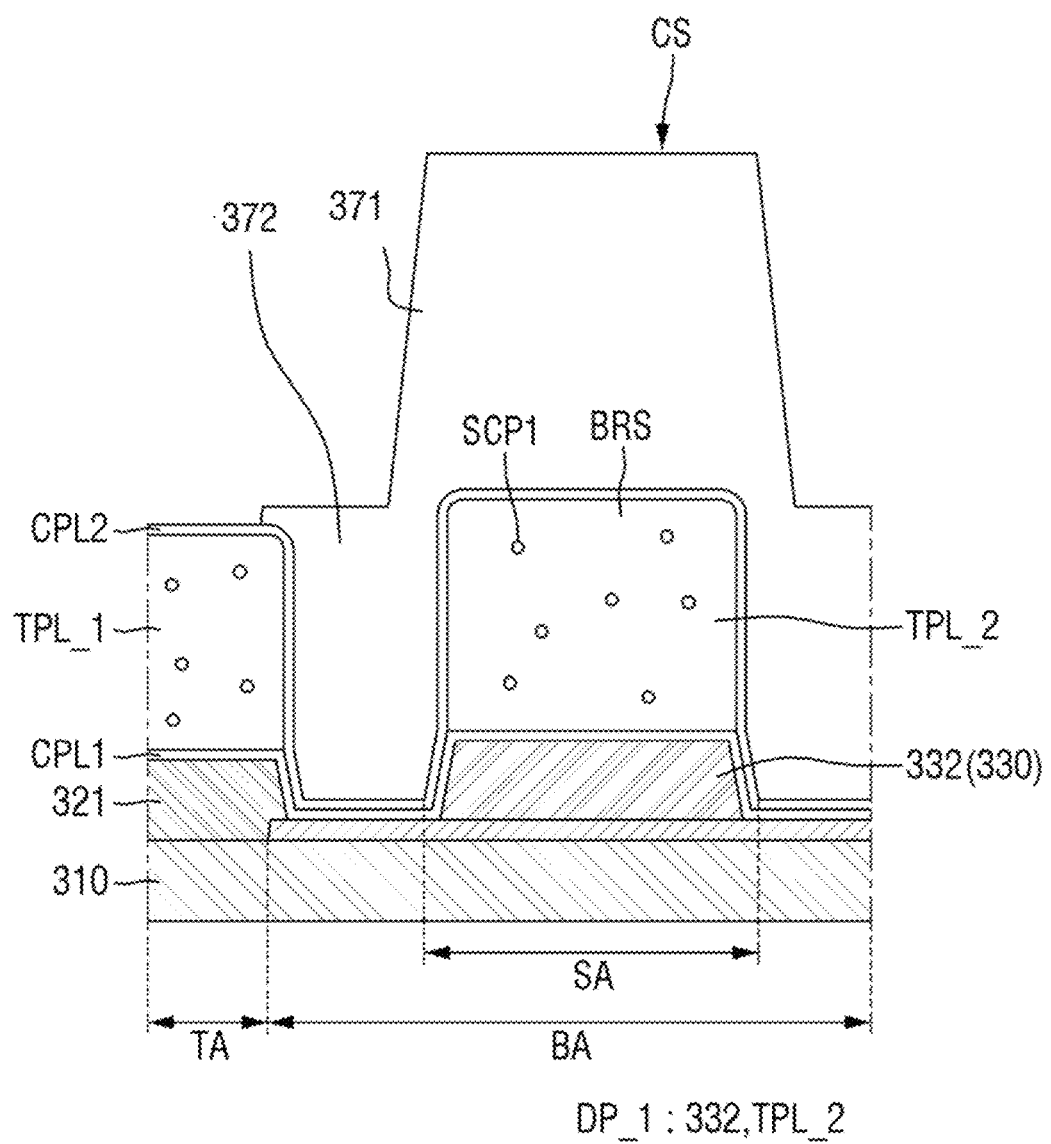
FIG. 15 is an enlarged cross-sectional view of a spacer of a display device according to an exemplary embodiment of the present invention.

FIG. 15 is an enlarged cross-sectional view of a spacer of a display device according to an exemplary embodiment of the present invention.

Referring to FIG. 15 and further to FIG. 4, a second color filter layer 330 may include a second color filter 331 and a second dummy color pattern 332. The second color filter 331 may be disposed in a second light-emitting area TA2, and the second dummy color pattern 332 may be disposed in a spacer area SA of a light-blocking area BA. The second color filter 331 and the second dummy color pattern 332 may include the same material and may be formed and patterned by a single process. However, the present invention is not limited thereto. For example, the second color filter 331 and the second dummy color pattern 332 may include different materials from each other.

A light-transmitting dummy pattern TPL_2 may be disposed on the second dummy color pattern 332. The light-transmitting dummy pattern TPL_2 may overlap with the second dummy color pattern 332 in a thickness direction. For example, sidewalls of the light-transmitting dummy pattern TPL_2 may be aligned with sidewalls of the second dummy color pattern 332, but the present invention is not limited thereto. In addition, the sidewalls of the light-transmitting dummy pattern TPL_2 may be arranged on the inside of the sidewalls of the second dummy color pattern 332 so that at least parts of a surface of the light-transmitting dummy pattern TPL_2 may be exposed.

The second dummy color pattern 332 and the light-transmitting dummy pattern TPL_2 may form a dummy pattern DP_1, which is disposed in the spacer area SA. The dummy pattern DP_1 may protrude from a surface of a second substrate 310. As already mentioned above, due to the presence of the dummy pattern DP_1, which protrudes from the surface of the second substrate 310, a bank layer 370 may include a bank part 371, which is disposed in the spacer area SA and at least parts of the light-blocking area BA near the spacer area SA, and a spacer part 372, which is physically connected to the bank part 371 and protrudes from the bank part 371. Since the bank part 371 and the spacer part 372 have different heights, the bank layer 370 may have a height difference on the surface of the second substrate 310. The spacer part 372, which is projected by the dummy pattern DP_1 including the second dummy color pattern 332 and the light-transmitting dummy pattern TPL_2, may form a spacer CS.

Figure 16:
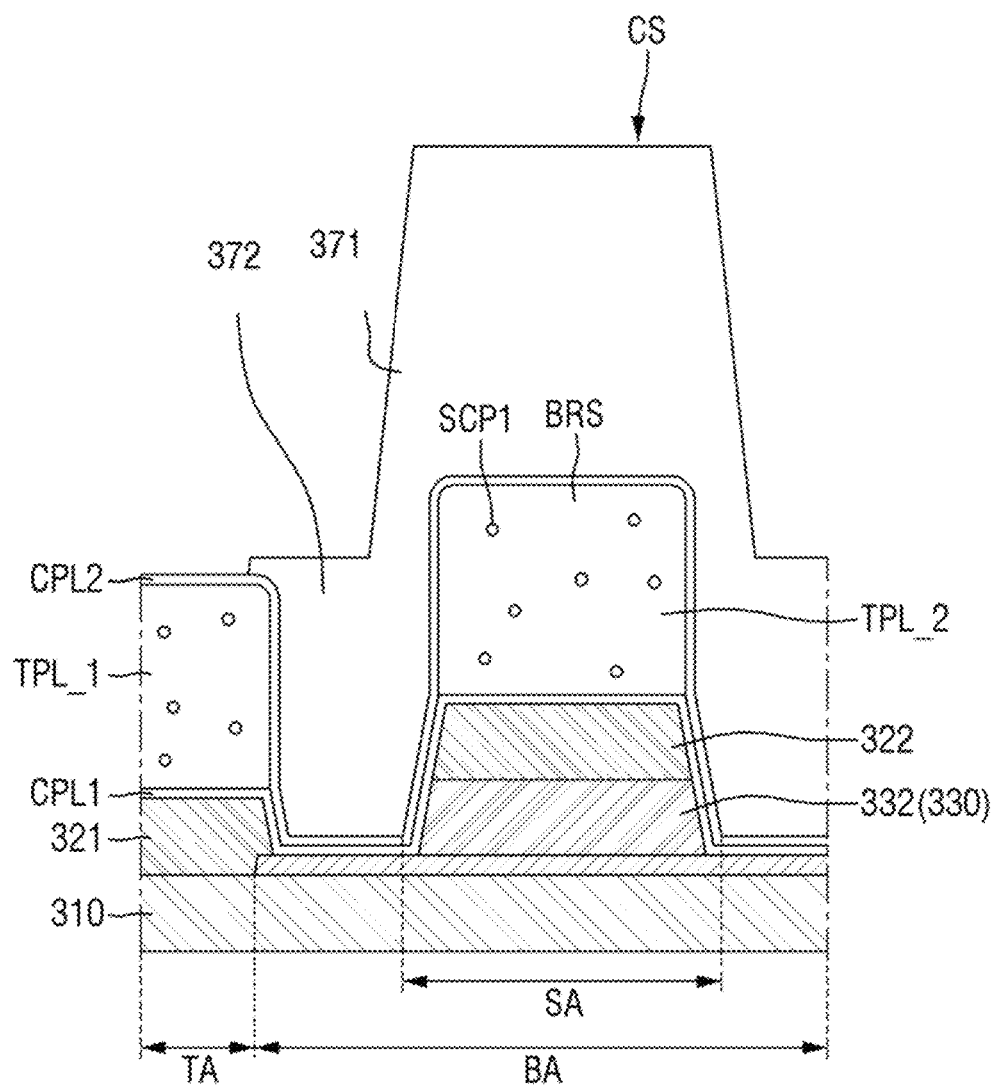
FIG. 16 is an enlarged cross-sectional view of a spacer of a display device according to an exemplary embodiment of the present invention.

FIG. 16 is an enlarged cross-sectional view of a spacer of a display device according to an exemplary embodiment of the present invention.

Referring to FIG. 16 and further to FIG. 4, a first color filter layer 320 may include a first color filter 321, which is disposed in a first light-emitting area TA1, and a first dummy color pattern 322, which is disposed in a spacer area SA of a light-blocking area BA, and a second color filter layer 330 may include a second color filter 331, which is disposed in a second light-emitting area TA2, and a second dummy color pattern 332, which is disposed in the spacer area SA of the light-blocking area BA.

The second dummy color pattern 332 may be disposed on an upper light-absorbing member UAB, in the spacer area SA. The first dummy color pattern 322 may be disposed on the second dummy color pattern 332, in the spacer area SA. The first dummy color pattern 322 may overlap with the second dummy color pattern 332 in a thickness direction.

A light-transmitting dummy pattern TPL_2 may be disposed on the first dummy color pattern 322. The light-transmitting dummy pattern TPL_2 may overlap with the first and second dummy color patterns 322 and 332 in the thickness direction. Sidewalls of the light-transmitting dummy pattern TPL_2, sidewalls of the first dummy color pattern 322, and sidewalls of the second dummy color pattern 332 may be aligned with one another, but the present invention is not limited thereto. In addition, the sidewalls of any one of the light-transmitting dummy pattern TPL_2, the first dummy color pattern 322, and the second dummy color pattern 332 may be arranged on the inside of the sidewalls of their respective underlying layers.

The first dummy color pattern 322, the second dummy color pattern 332, and the light-transmitting dummy pattern TPL_2 may form a dummy pattern DP_2, which is disposed in the spacer area SA. The dummy pattern DP_2 may protrude from a surface of a second substrate 310. As the dummy pattern DP_2 is formed with multiple color filter layers, for example, the first and second color filter layers 320 and 330, the height of the spacer CS can be controlled by controlling the height of the dummy pattern DP_2. For example, the height of the spacer CS from the surface of the second substrate 310 can be controlled with the number of color filter layers disposed in the spacer area SA, e.g., the number of dummy color patterns stacked and the thicknesses of the dummy color patterns.

The first dummy color pattern 322 is illustrated as being disposed on the second dummy color pattern 332, but the present invention is not limited thereto. In addition, the second dummy color pattern 332 may be disposed on the first dummy color pattern 322. The arrangement of dummy color patterns in the dummy pattern DP_2, which is disposed in the spacer area SA, may vary depending on the order in which to form the first color filter layer 320, the second color filter layer 330, and a third color filter layer 340.

Figure 17:
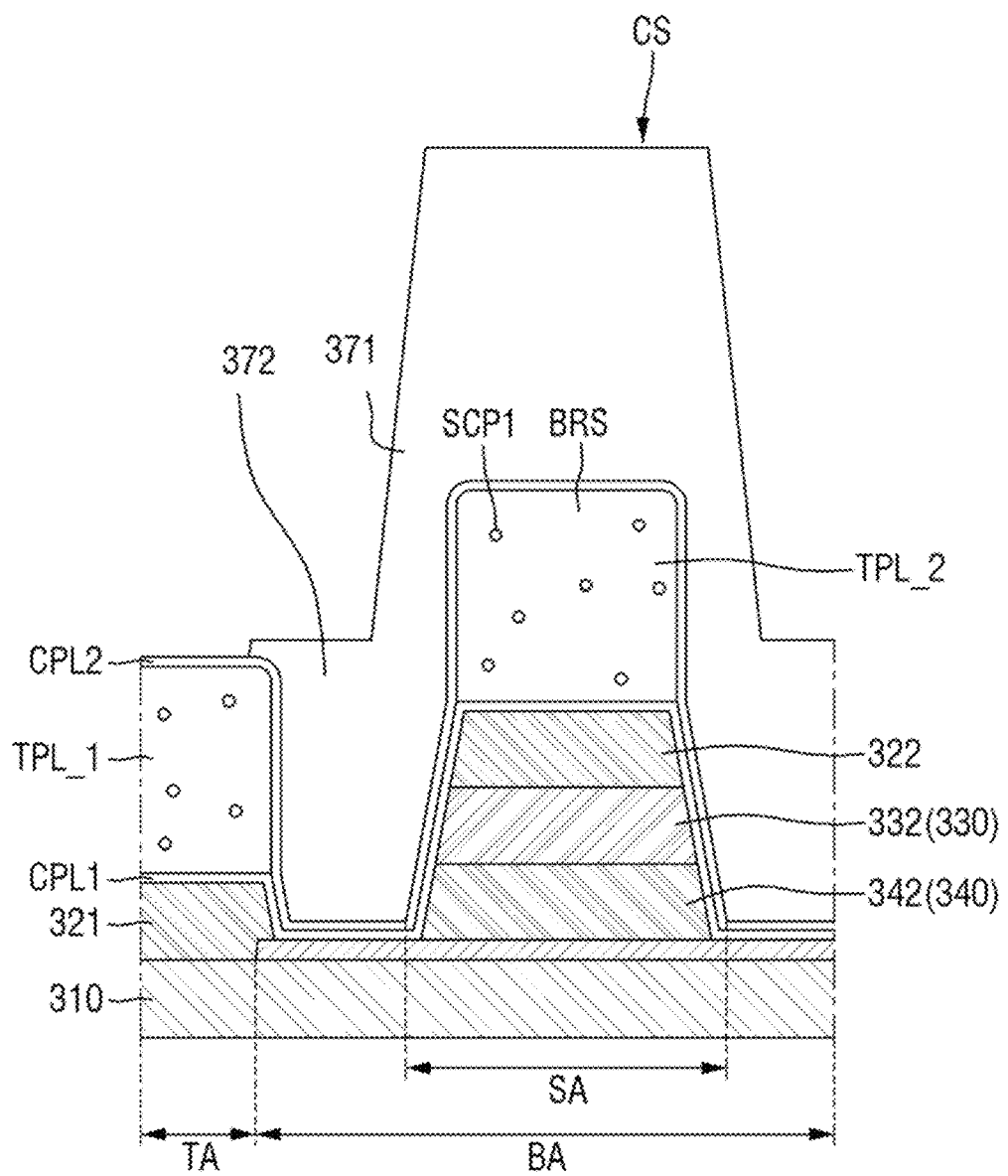
FIG. 17 is an enlarged cross-sectional view of a spacer of a display device according to an exemplary embodiment of the present invention.

FIG. 17 is an enlarged cross-sectional view of a spacer of a display device according to an exemplary embodiment of the present invention.

Referring to FIG. 17 and further to FIG. 4, a first color filter layer 320 may include a first color filter 321, which is disposed in a first light-emitting area TA1, and a first dummy color pattern 322, which is disposed in a spacer area SA of a light-blocking area BA. A second color filter layer 330 may include a second color filter 331, which is disposed in a second light-emitting area TA2, and a second dummy color pattern 332, which is disposed in the spacer area SA of the light-blocking area BA. A third color filter layer 340 may include a third color filter 341, which is disposed in a third light-emitting area TA3, and a third dummy color pattern 342, which is disposed in the spacer area SA of the light-blocking area BA.

A dummy pattern DP_3 may include the third dummy color pattern 342, the second dummy color pattern 332, the first dummy color pattern 322, and the light-transmitting dummy pattern TPL_2, which are disposed on an upper light-absorbing member UAB, in the spacer area SA of the light-blocking area BA. The second dummy color pattern 332 may be disposed on the third dummy color pattern 342, the first dummy color pattern 322 may be disposed on the second dummy color pattern 332, and the light-transmitting dummy pattern TPL_2 may be disposed on the first dummy color pattern 322. The first, second, and third dummy color patterns 322, 332, and 342 and the light-transmitting dummy pattern TPL_2 may overlap with one another in a thickness direction. As the dummy pattern DP_3 is formed with the first, second, and third dummy color patterns 322, 332, and 342, the height of a spacer CS can be controlled by controlling the height of the dummy pattern DP_3.

Figure 18:
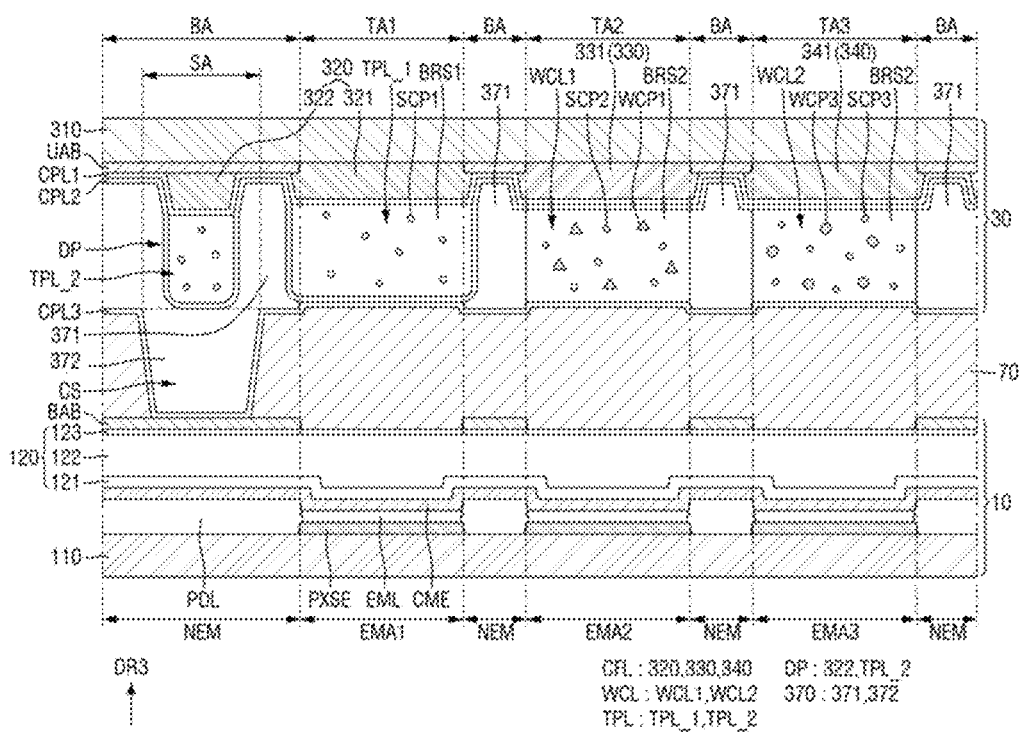
FIG. 18 is a cross-sectional view of a display device according to an exemplary embodiment of the present invention.

FIG. 18 is a cross-sectional view of a display device according to an exemplary embodiment of the present invention.

The display device of FIG. 18 differs from the display device 1 of FIG. 4 in that a display substrate 10 further includes a lower light-absorbing member BAB.

Referring to FIG. 18, the lower light-absorbing member BAB of the display substrate 10 may be disposed on a thin-film encapsulation structure 120. The lower light-absorbing member BAB may be disposed to overlap with a pixel-defining film PDL. The lower light-absorbing member BAB may prevent light emitted from an emission layer EML from being mixed into light-emitting areas of neighboring subpixels PXS. Due to the presence of the lower light-absorbing member BAB, the mixing of colors between different subpixels PXS can be further prevented.

The lower light-absorbing member BAB may include an organic material. For example, the lower light-absorbing member BAB may include a light-absorbing material capable of absorbing visible light. For example, the lower light-absorbing member BAB may be formed of a material that can be used as a black matrix. The lower light-absorbing member BAB may be a type of light-blocking member. The lower light-absorbing member BAB may overlap with an upper light-absorbing member UAB in a thickness direction. The lower light-absorbing member BAB may be disposed in the light blocking area BA.

While the present invention has been described with reference to the exemplary embodiments thereof, it will be understood by those of ordinary skill in the art that various changes in form and detail may be made thereto without departing from the spirit and scope of the present invention.

What is claimed is:

1. A display device comprising:
   a substrate including light-emitting areas and a light-blocking area including a spacer area;
   a color filter layer disposed on the substrate and including color filters, and a dummy color pattern, wherein the color filters are disposed in the light emitting areas, and the dummy color pattern is disposed in the spacer area;
   a light-transmitting layer disposed on the color filter layer and including a light-transmitting pattern and a light-transmitting dummy pattern, wherein the light-transmitting pattern is disposed on the color filters, and the light-transmitting dummy pattern is disposed on the dummy color pattern; and
   a bank layer disposed on the dummy color pattern,
   wherein the bank layer includes a spacer part disposed in the light-blocking area, and a bank part disposed in the light-blocking area, wherein the spacer part overlaps the spacer area, wherein the bank part has a smaller height than the spacer part with respect to the substrate, and does not overlap the spacer area.

2. The display device of claim 1, wherein the color filters include a first color filter, a second color filter, and a third color filter, wherein the first color filter selectively transmits light of a first color therethrough, wherein the second color filter selectively transmits light of a second color therethrough, and wherein the third color filter selectively transmits light of a third color therethrough.

3. The display device of claim 2, wherein the dummy color pattern includes the same material as at least one of the first, second, or third color filters.

4. The display device of claim 2, wherein
   the dummy color pattern includes a first dummy color pattern and a second dummy color pattern disposed on the first dummy color pattern,
   the first dummy color pattern includes the same material as the first color filter, and
   the second dummy color pattern includes the same material as the second color filter.

5. The display device of claim 2, further comprising:
   a wavelength conversion layer disposed on the color filter layer, in the light-emitting areas,
   wherein
   the light-transmitting pattern is disposed on the first color filter, and
   the wavelength conversion layer includes a first wavelength conversion pattern, and a second wavelength conversion pattern, wherein the first wavelength conversion pattern is disposed on the second color filter, and the second wavelength conversion pattern is disposed on the third color filter.

6. The display device of claim 5, wherein the first color is blue, the second color is green, and third color is red.

7. The display device of claim 1, wherein
   the light-transmitting dummy pattern overlaps with the dummy color pattern,
   the light-transmitting dummy pattern and the dummy color pattern form the dummy pattern, and
   the spacer part overlaps with the dummy pattern.

8. The display device of claim 7, wherein the spacer part and the bank part are integrally formed.

9. The display device of claim 7, wherein the bank layer at least partially covers the dummy pattern.

10. The display device of claim 1, wherein the bank layer is not disposed in the light-emitting areas.

11. A display device comprising:
    a display substrate including a first substrate; subpixel electrodes disposed on the first substrate and provided in their respective subpixels; a pixel-defining film disposed on the surface of the first substrate, along boundaries of each of the subpixels, and exposes the subpixel electrodes; an emission layer disposed on the subpixel electrodes exposed by the pixel-defining film; and a common electrode disposed on the emission layer, and
    a color conversion substrate including a second substrate including a plurality of light-emitting areas and a light-blocking area surrounding the light-emitting areas; a color filter layer disposed on a surface of the second substrate facing the first substrate and includes a plurality of color filters disposed in their respective light-emitting areas and a dummy color pattern disposed in the light-blocking area; a light-transmitting layer disposed on the color filter layer and includes a light-transmitting dummy pattern disposed on the dummy color pattern; and a bank layer disposed in the light-blocking area,
    wherein
    the dummy color pattern and the light-transmitting dummy pattern form a dummy pattern, and
    the bank layer includes a spacer part and a bank part, wherein the spacer part overlaps the dummy pattern, and wherein the bank part does not overlap with the dummy pattern and has a larger height than the spacer part with respect to the first substrate.

12. The display device of claim 11, wherein the color filters include a first color filter, a second color filter, and a third color filter, wherein the first color filter selectively transmits light of a first color therethrough and overlaps a first light-emitting area among the plurality of light-emitting areas, wherein the second color filter selectively transmits light of a second color therethrough and overlaps a second light-emitting area among the plurality of light-emitting areas, wherein the third color filter selectively transmits light of a third color therethrough and overlaps a third light-emitting area among the plurality of light-emitting areas.

13. The display device of claim 12, wherein the dummy color pattern includes the same material as at least one of the first, second, or third color filters.

14. The display device of claim 12, wherein the dummy color pattern includes a first dummy color pattern and a second dummy color pattern disposed on the first dummy color pattern.

15. The display device of claim 14, wherein
the first dummy color pattern includes the same material as the first color filter, and
the second dummy color pattern includes the same material as the second color filter.

16. The display device of claim 12, wherein
the light-transmitting layer further includes a light-transmitting pattern disposed on the first color filter, and
the color conversion substrate further includes a first wavelength conversion pattern, and a second wavelength conversion pattern, wherein the first wavelength conversion pattern converts light of the first color into light of the second color and is disposed on the second color filter, wherein the second wavelength conversion pattern converts light of the first color into light of the third color and is disposed on the third color filter.

17. The display device of claim 11, wherein the bank part and the spacer part are integrally formed.

18. The display device of claim 11, wherein the bank layer overlaps with the pixel-defining film in a thickness direction.

19. The display device of claim 11, wherein the spacer part is disposed on the display substrate.

20. The display device of claim 11, further comprising:
a filling layer disposed between the display substrate and the color conversion substrate to couple the display substrate and the color conversion substrate to each other.

* * * * *